United States Patent
Kitao et al.

(10) Patent No.: US 9,779,992 B2
(45) Date of Patent: Oct. 3, 2017

(54) SEMICONDUCTOR DEVICE AND METHOD OF MANUFACTURING THE SAME

(71) Applicant: Renesas Electronics Corporation, Tokyo (JP)

(72) Inventors: Ryohei Kitao, Tokyo (JP); Yasuaki Tsuchiya, Tokyo (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 12 days.

(21) Appl. No.: 15/013,068

(22) Filed: Feb. 2, 2016

(65) Prior Publication Data

US 2016/0148841 A1 May 26, 2016

Related U.S. Application Data

(62) Division of application No. 13/961,497, filed on Aug. 7, 2013, now Pat. No. 9,275,935.

(30) Foreign Application Priority Data

Aug. 29, 2012 (JP) .................................. 2012-189177

(51) Int. Cl.
*H01L 23/48* (2006.01)
*H01L 21/768* (2006.01)
(Continued)

(52) U.S. Cl.
CPC .. *H01L 21/76898* (2013.01); *H01L 21/02271* (2013.01); *H01L 23/481* (2013.01);
(Continued)

(58) Field of Classification Search
None
See application file for complete search history.

(56) References Cited

U.S. PATENT DOCUMENTS 7,528,068 B2    5/2009  Soejima et al.
2005/0221601 A1* 10/2005  Kawano ............ H01L 21/76898
                                                      438/622
(Continued)

FOREIGN PATENT DOCUMENTS

JP      2005-294582 A    10/2005

OTHER PUBLICATIONS

U.S. Notice of Allowance dated Oct. 23, 2015 in co-pending U.S. Appl. No. 13/961,497.

(Continued)

*Primary Examiner* — Midhael Lebentritt
*Assistant Examiner* — Jordan Klein
(74) *Attorney, Agent, or Firm* — McGinn IP Law Group, PLLC.

(57) ABSTRACT

A method of manufacturing a semiconductor device includes forming a first via having a first diameter in a first main surface of a semiconductor substrate having a first thickness, after forming a first insulating film on a bottom surface and a side surface of the first via, forming a first through electrode inside the first via a first barrier metal film, after forming the first through electrode, processing the semiconductor substrate from a second main surface on an opposite side of the first main surface to reduce the first thickness of the semiconductor substrate to a second thickness thinner than the first thickness, after processing the semiconductor substrate, forming a third insulating film on the second main surface of the semiconductor substrate, and after forming the third insulating film, sequentially processing the third insulating film and the semiconductor substrate.

20 Claims, 22 Drawing Sheets

(51) Int. Cl.
*H01L 23/532* (2006.01)
*H01L 21/02* (2006.01)
*H01L 23/522* (2006.01)
*H01L 23/00* (2006.01)
*H01L 21/683* (2006.01)

(52) U.S. Cl.
CPC .... *H01L 23/53238* (2013.01); *H01L 21/6835* (2013.01); *H01L 23/522* (2013.01); *H01L 24/03* (2013.01); *H01L 24/05* (2013.01); *H01L 24/11* (2013.01); *H01L 24/13* (2013.01); *H01L 24/14* (2013.01); *H01L 2221/6834* (2013.01); *H01L 2221/6835* (2013.01); *H01L 2221/68327* (2013.01); *H01L 2221/68372* (2013.01); *H01L 2224/03002* (2013.01); *H01L 2224/0401* (2013.01); *H01L 2224/0557* (2013.01); *H01L 2224/05157* (2013.01); *H01L 2224/05166* (2013.01); *H01L 2224/05176* (2013.01); *H01L 2224/05181* (2013.01); *H01L 2224/05187* (2013.01); *H01L 2224/05571* (2013.01); *H01L 2224/05647* (2013.01); *H01L 2224/05657* (2013.01); *H01L 2224/06181* (2013.01); *H01L 2224/11002* (2013.01); *H01L 2224/11334* (2013.01); *H01L 2224/11849* (2013.01); *H01L 2224/131* (2013.01); *H01L 2224/13022* (2013.01); *H01L 2224/13144* (2013.01); *H01L 2224/13147* (2013.01); *H01L 2224/13155* (2013.01); *H01L 2224/14051* (2013.01); *H01L 2224/14181* (2013.01); *H01L 2224/14505* (2013.01); *H01L 2924/00014* (2013.01)

(56) References Cited

U.S. PATENT DOCUMENTS

| | | | | |
|---|---|---|---|---|
| 2005/0233581 A1* | 10/2005 | Soejima | H01L 21/76898 | 438/667 |
| 2007/0032059 A1* | 2/2007 | Hedler | H01L 21/76898 | 438/597 |
| 2007/0281474 A1* | 12/2007 | Suzuki | H01L 21/30655 | 438/677 |
| 2008/0217782 A1* | 9/2008 | Frank | H01L 21/76898 | 257/755 |
| 2008/0284041 A1* | 11/2008 | Jang | H01L 21/76898 | 257/774 |
| 2010/0105169 A1* | 4/2010 | Lee | H01L 21/76898 | 438/107 |
| 2012/0056330 A1* | 3/2012 | Lee | H01L 21/76898 | 257/774 |
| 2012/0164788 A1* | 6/2012 | Ide | H01L 23/481 | 438/109 |
| 2013/0119543 A1* | 5/2013 | Yu | H01L 21/76898 | 257/741 |

OTHER PUBLICATIONS

U.S. Office Action dated Apr. 7, 2015 in co-pending U.S. Appl. No. 13/961,497.

Taiwanese Office Action dated Nov. 22, 2016 and English translation thereof.

\* cited by examiner

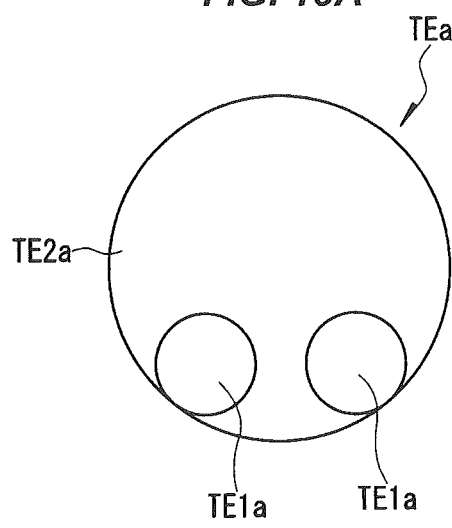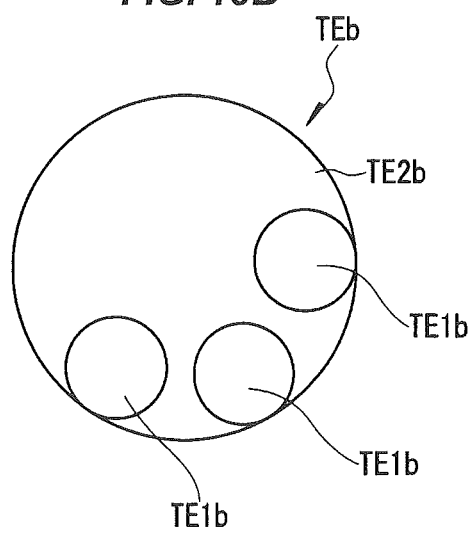
FIG. 18A
FIG. 18B

SEMICONDUCTOR DEVICE AND METHOD OF MANUFACTURING THE SAME

The present application is a Divisional Application of U.S. patent application Ser. No. 13/961,497, filed on Aug. 7, 2013, which is based on and claims priority from Japanese Patent Application No. 2012-189177, filed on Aug. 29, 2012, the entire contents of which are incorporated herein by reference.

BACKGROUND

The present invention relates to a semiconductor device and technology of manufacturing the same and, for example, can be suitably utilized for TSV (Through Silicon Via) technology required for the manufacture of a three-dimensional multifunction device.

There is known TSV technology as important technology for achieving a three-dimensional multifunction device. The TSV technology is the one to form a through electrode that penetrates a semiconductor substrate perpendicular to a thickness direction.

For example, Japanese Patent Laid-Open No. 2005-294582 (Patent Document 1) discloses a semiconductor device including a through electrode constituted of a small-diameter plug and a large-diameter plug. A projecting portion (lower surface) of the small-diameter plug that projects from a silicon (Si) substrate penetrates into a top surface of the large-diameter plug, and a top surface of the small-diameter plug is coupled to a first wiring.

SUMMARY

When a through electrode penetrating from a main surface of a silicon (Si) substrate to a back surface on an opposite side of the main surface is formed in the silicon (Si) substrate, distortion is generated in the silicon (Si) substrate on a periphery of the through electrode due to a difference of thermal expansion coefficients of a metal conductor constituting the through electrode and silicon (Si). Therefore, a region (keep out zone) where arrangement of semiconductor elements is limited is generated on the periphery of the through electrode. In addition, since a plurality of signal wirings cannot be arranged right above the through electrode, a constraint is generated in a wiring layout. Such problems have been adverse effects in promoting high integration of a semiconductor device employing the TSV technology.

The other problems and the new feature will become clear from the description of the present specification and the accompanying drawings.

According to one embodiment, a through electrode is configured with a small-diameter through electrode formed on a main surface side of a semiconductor substrate, and a large-diameter through electrode formed on a back surface side of the semiconductor substrate, and the small-diameter through electrode is arranged inside the large-diameter through electrode in a planar view so that a center position of the small-diameter through electrode and a center position of the large-diameter through electrode do not coincide with each other in the planar view.

According to one embodiment, high integration of the semiconductor device employing the TSV technology can be achieved.

BRIEF DESCRIPTION OF THE DRAWINGS

FIGS. 18A and 18B are respectively main part plan views illustrating arrangement of small-diameter through electrodes and a large-diameter through electrode according to a First Modification of the First Embodiment;

DETAILED DESCRIPTION

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step etc.) is not necessarily indispensable, except for the case where it is clearly specified in particular and where it is considered to be clearly indispensable from a theoretical point of view, etc.

Furthermore, when terms "constituted of A", "constituted by A", "having A", and "including A" are used, it is needless to say that elements other than A are not eliminated, except for the case where it is clearly specified in particular that A is the only element, etc. Similarly, in the following embodiments, when shape, position relationship, etc. of an element etc. are referred to, what resembles or is similar to the shape substantially shall be included, except for the case where it is clearly specified in particular and where it is considered to be clearly not right from a theoretical point of view. This statement also applies to the numeric value and range described above.

Moreover, in drawings used for the following embodiments, in order to make a drawing easily viewable, hatching may be attached even if it is a plan view. Furthermore, in the following embodiments, when a term "wafer" is used, it mainly means an Si (Silicon) single crystal wafer, but is not limited to that, and it shall mean an insulating film substrate for forming an SOI (Silicon On Insulator) wafer and an integrated circuit thereover, etc. Also a shape of the wafer is not limited to a circle or substantially a circle, but also includes a square, a rectangle, etc.

In all the drawings for explaining the following embodiments, the same symbol is attached to the element having the same function, as a principle, and the repeated explanation thereof is omitted. Hereinafter, embodiments will be explained in detail based on the drawings.

(TSV Technology Examined by the Present Inventors)

Since a semiconductor device employing TSV technology according to the present embodiment is considered to be clearer, problems in a semiconductor device that the present inventors have compared and examined will be explained.

Figure 23:
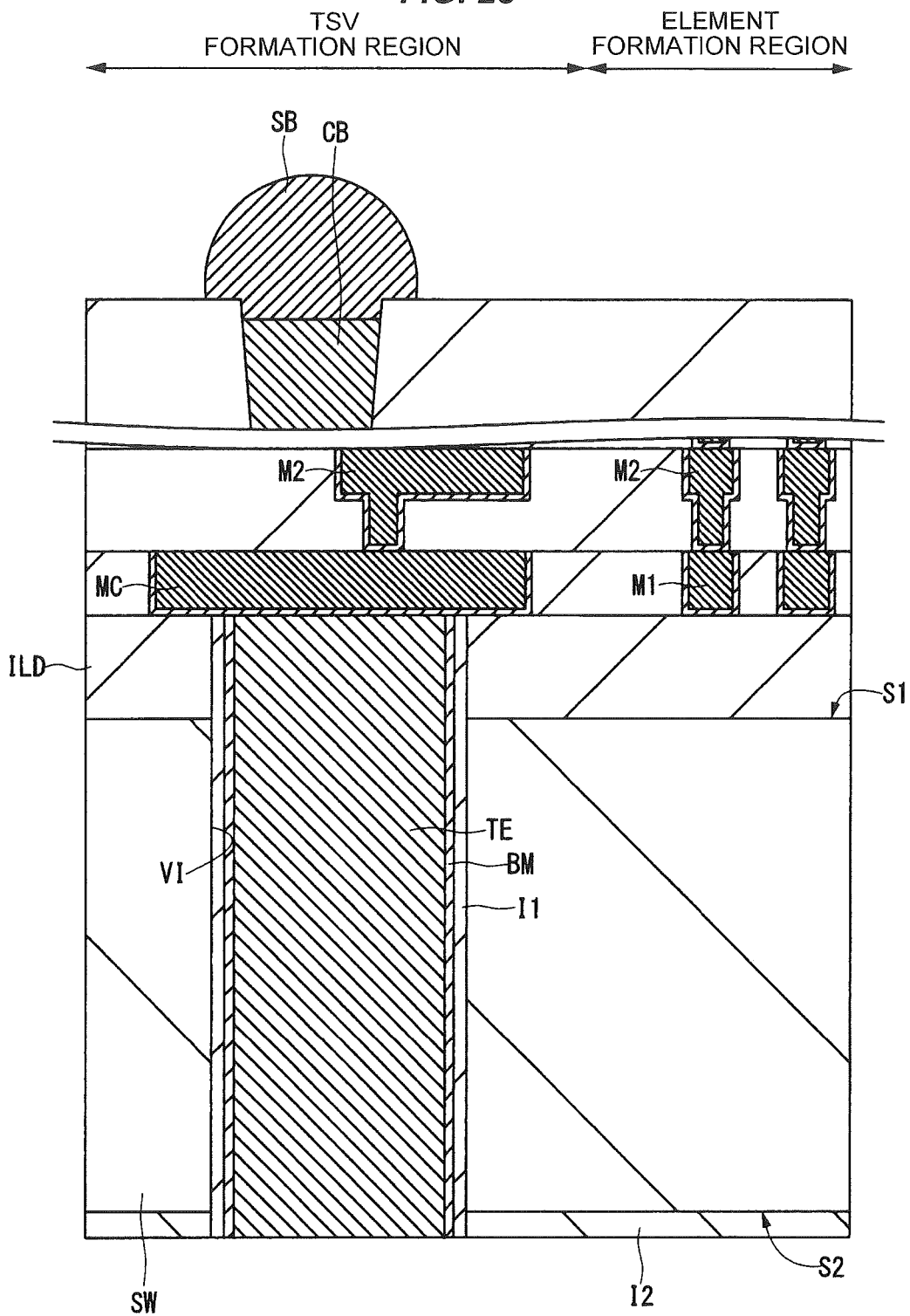
FIG. 23 is a main part cross-sectional view of a semiconductor device illustrating a manufacturing step of a through electrode compared and examined by the present inventors.

First, using FIG. 23, will be briefly explained one example of a manufacturing step of a through electrode by a via middle scheme that the present inventors have examined. FIG. 23 is a main part cross-sectional view of the semiconductor device illustrating the manufacturing step of the through electrode.

Prepared is, for example, a semiconductor wafer (a semiconductor thin plate referred to as a wafer whose flat surface is substantially circular) SW that is constituted of single crystal silicon (Si). Although illustration is omitted, a plurality of semiconductor elements is formed on a main surface (a surface or a first main surface) S1 of the semiconductor wafer SW. An interlayer insulating film ILD is then formed over the main surface S1 of the semiconductor wafer SW so as to cover these semiconductor elements.

Next, by dry etching in which a resist pattern is used as a mask, the interlayer insulating film ILD and the semiconductor wafer SW are sequentially processed to form a via (a through hole, a connection hole, or an opening) VI in a region where a through electrode is formed (a region where the semiconductor elements are not formed). After that, a copper (Cu)-plated film is buried inside the via VI via an insulating film I1 constituted of silicon oxide ($SiO_2$) and a barrier metal film BM constituted of tantalum (Ta), etc., and a through electrode TE constituted of a copper (Cu) film is formed.

Subsequently, formed are first-layer wirings M1, and a coupling pad MC that is located in the same layer as the first-layer wirings M1 and is coupled to the through electrode TE. After that, after second-layer wirings M2 and more-upper-layer wirings are formed, a copper (Cu) bump CB is formed to be coupled to a top-layer wiring, and an external terminal SB is formed to be coupled to the copper (Cu) bump CB.

Next, a back surface (a second main surface) S2 on an opposite side of the main surface S1 of the semiconductor wafer SW is grinded, polished, or etched back. As a result of this, a thickness of the semiconductor wafer SW is made thinner and further, a bottom of the through electrode TE covered with the insulating film I1 and the barrier metal film BM is caused to project from the back surface S2 of the semiconductor wafer SW. Subsequently, an insulating film I2 is formed on the back surface S2 of the semiconductor wafer SW so as to cover the bottom of the through electrode TE that projects from the back surface S2 of the semiconductor wafer SW and is covered with the insulating film I1 and the barrier metal film BM.

Subsequently, the insulating film I2, the insulating film I1, and the barrier metal film BM that cover the bottom of the through electrode TE are polished by a CMP (Chemical Mechanical Polishing) method to expose a lower surface of the through electrode TE.

<Problem 1>

When the through electrode TE penetrating from the main surface S1 of the semiconductor wafer SW to the back surface S2 on the opposite side of the main surface S1 is formed in the semiconductor wafer SW, distortion is generated in the semiconductor wafer SW on a periphery of the through electrode TE due to a difference between thermal expansion coefficients of copper (Cu) constituting the through electrode TE and silicon (Si) constituting the semiconductor wafer SW. Therefore, a region where the semiconductor elements can be arranged is limited. For example, when the via VI with a diameter of 5 μm is formed in the semiconductor wafer SW, a range of approximately 1 μm from an outer circumference of the via VI corresponds to a region (keep out zone) where arrangement of the semiconductor elements is limited. The region (keep out zone) where arrangement of the semiconductor elements is limited becomes wider as the diameter of the via VI becomes larger, i.e., a volume of copper (Cu) buried inside the via VI is more increased.

In addition, since the coupling pad MC coupled to the through electrode TE is arranged right above the through electrode TE, a plurality of signal wirings cannot be arranged. Therefore, a constraint is generated in a wiring layout.

In order to narrow the region (keep out zone) where arrangement of the semiconductor elements is limited, or to extend a region where a plurality of signal wirings can be arranged, the diameter of the via VI may be reduced to reduce the volume of the through electrode TE. However, in a case of the vias VI having a same depth, an aspect ratio (a via depth/a via diameter) of the via VI with a small diameter is higher as compared with that of the via VI with a large diameter, the via VI being formed in the semiconductor wafer SW. Therefore, when the diameter of the via VI is reduced, such a problem that the copper (Cu)-plated film is hard to bury inside the via VI occurs.

<Problem 2>

When the back surface S2 of the semiconductor wafer SW is processed and the thickness of the semiconductor wafer SW is made thinner, there has been fear that a part of the insulating films I1 that covers the lower surface of the through electrode TE is removed, and the lower surface of the through electrode TE is exposed. When the lower surface of the through electrode TE is exposed, copper (Cu) constituting the through electrode TE is diffused into the semiconductor wafer SW from the back surface S2 of the semiconductor wafer SW. As a result of it, operation characteristics of the semiconductor elements formed on the main surface S1 of the semiconductor wafer SW are changed due to copper (Cu) contamination.

<Problem 3>

In addition, the present inventors also examined manufacturing steps of a through electrode by a via-last and via-back scheme (the scheme in which after semiconductor elements and multi-layer wirings are formed on a main surface side of a semiconductor substrate, a via is formed in the semiconductor substrate from a back surface side of the semiconductor substrate, and a through electrode is buried inside the via).

However, there is a risk that the multi-layer wirings formed on the main surface side of the semiconductor substrate are etched when the above-described via is formed in the semiconductor wafer.

As explained hereinbefore, in the semiconductor device employing the TSV technology, it is necessary to minimize a formation region of the semiconductor elements and an arrangement region of the wirings that are constrained by the arrangement of the through electrode. In addition, it is necessary to avoid problems, such as copper (Cu) contamination generated in the manufacturing steps of the through electrode.

Note that it has become obvious from examination by the present inventors that particularly, a problem of the keep out zone due to distortion generated in the silicon (Si) substrate on the periphery of the through electrode is difficult to avoid by just constituting the through electrode by the small-diameter plug and the large-diameter plug as in the above-mentioned Patent Document 1.

First Embodiment

<<Semiconductor Device>>

Figure 1:
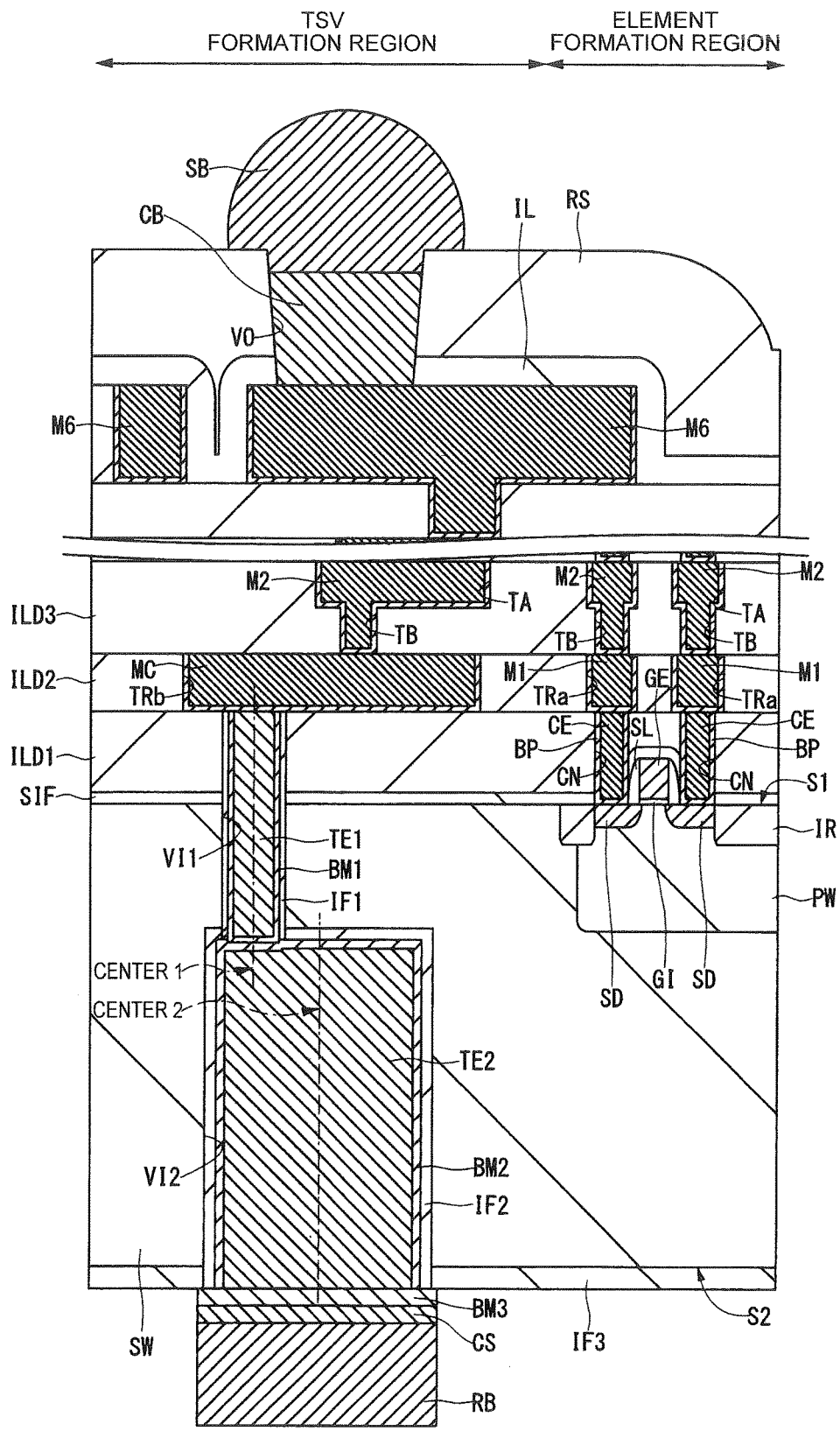
FIG. 1 is a main part cross-sectional view of a semiconductor device including a TSV according to a First Embodiment.
Figure 2:
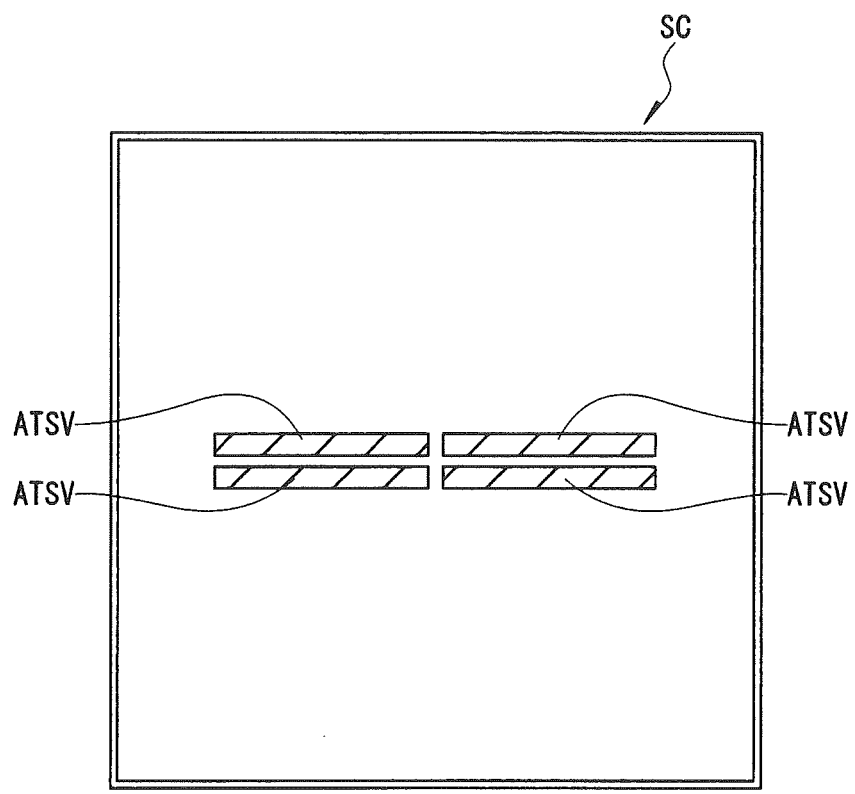
FIG. 2 is a main part back surface view of the semiconductor device according to the First Embodiment.

A semiconductor device including a TSV according to the present First Embodiment will be explained using FIGS. 1 and 2. FIG. 1 is a main part cross-sectional view of the semiconductor device, and FIG. 2 is a main part back surface view of the semiconductor device.

In a semiconductor device (semiconductor chip), a region (hereinafter referred to as an element formation region (a second region)) where various semiconductor elements, such as a field effect transistor, a resistive element, and a capacitive element, have been formed, and a region (hereinafter referred to as a TSV formation region (a first region)) where a plurality of through electrodes has been formed are provided in different regions from each other. In FIG. 1, exemplified is an n-channel type MISFET (Metal Insulator Semiconductor Field Effect Transistor) that represents the field effect transistor among the various semiconductor elements formed in the element formation region. In addition, in the following explanation, the n-channel type MISFET is abbreviated to an nMISFET.

First, a configuration of the nMISFET formed in the element formation region will be explained using FIG. 1.

As shown in FIG. 1, an isolation portion IR that is an isolation groove inside which an insulating film has been buried is formed in the main surface (the surface or the first main surface) S1 of the semiconductor wafer SW of the element formation region, and an active region where the nMISFET is formed is defined by the isolation portion IR. A thickness of the semiconductor wafer SW is, for example, approximately 50 μm. A p-type well PW is formed in the main surface S1 of the semiconductor wafer SW, and the nMISFET is formed in a region where the p-type well PW has been formed. A gate electrode GE is formed on the main surface S1 of the semiconductor wafer SW via a gate insulating film GI of the nMISFET. The gate insulating film GI is, for example, constituted of silicon oxide ($SiO_2$) formed by a thermal oxidation method, and the gate electrode GE is, for example, constituted of polycrystalline silicon (Si) formed by a CVD (Chemical Vapor Deposition) method.

A sidewall SL is formed on a side surface of the gate electrode GE of the nMISFET. This sidewall SL is, for example, constituted of silicon oxide ($SiO_2$) or silicon nitride ($Si_3N_4$). In addition, n-type semiconductor regions SD that function as a source and a drain are formed sandwiching a channel region in the p-type well PW on both sides of the gate electrode GE of the nMISFET.

Furthermore, the nMISFET is covered with a stopper insulating film SIF and an interlayer insulating film ILD1. The stopper insulating film SIF is, for example, constituted of silicon nitride ($Si_3N_4$). In addition, the interlayer insulating film ILD1 is, for example, constituted of silicon oxide ($SiO_2$), and a surface thereof is planarized. A connection hole (illustration is omitted) that reaches the gate electrode GE, and connection holes CN that reach the n-type semiconductor regions SD are formed in the stopper insulating film SIF and the interlayer insulating film ILD1. The connection hole CN is columnar, and a diameter thereof is set to be the same as or to be smaller than a line width of the first-layer wiring M1 and, for example, is approximately 0.06 μm. Coupling electrodes (plugs) CE constituted of metal are formed inside the connection holes CN via the barrier metal film BP.

On the coupling electrode CE, the first-layer wiring M1 in which, for example, a copper (Cu) film serves as a main conductor is formed by a single damascene method, coupled to the coupling electrode CE. Namely, the first-layer wirings M1 are formed by forming wiring formation trenches TRa in an interlayer insulating film ILD2 deposited on the coupling electrodes CE and the interlayer insulating film ILD1, and burying the copper (Cu) film inside the wiring formation trenches TRa. A barrier metal film is formed between an inner wall and the copper (Cu) film of the wiring formation trench TRa. The line width of the first-layer wiring M1 is, for example, approximately 0.1 μm.

Furthermore, on the first-layer wirings M1, the second-layer wirings M2 in each of which, for example, a copper (Cu) film serves as a main conductor are formed by a dual damascene method, coupled to the first-layer wirings M1 via coupling components. Namely, the second-layer wirings M2 are formed by forming a wiring formation trench TA in an interlayer insulating film ILD3 deposited on the first-layer wirings M1 and the interlayer insulating film ILD2, further forming a connection hole TB in a portion linking the wiring formation trench TA and the first-layer wirings M1, and burying the copper (Cu) film inside the wiring formation trench TA and connection hole TB. The coupling component formed integrally with the second-layer wiring M2 is formed inside the connection hole TB. The barrier metal film is formed between an inner wall and the copper (Cu) film of each of the wiring formation trench TA and the connection hole TB. It is to be noted that the second-layer wirings M2 may be formed by the single damascene method similarly to the first-layer wirings M1.

Furthermore, on the second-layer wirings M2, upper-layer wirings are formed, and an insulating film IL and sealing resin RS are formed so as to cover top-layer wirings (sixth-layer wirings M6 in the First Embodiment). An opening VO that reaches the sixth-layer wiring M6 is formed in the insulating film IL and sealing resin RS, the copper (Cu) bump CB is formed, coupled to the sixth-layer wiring M6 inside the opening VO, and a hemispherical external terminal (solder ball) SB is further formed, coupled to the copper (Cu) bump CB.

It is to be noted that although the wirings in the six layers (the wirings M1 to M6) are exemplified in the First Embodiment, the present invention is not limited to this. The present invention may employ not more than wirings in five layers or not less than wirings in seven layers, and the above-described copper (Cu) bump CB and external terminal SB are formed, coupled to a top-layer wiring.

Next, a configuration of the TSV formed in the TSV formation region will be explained using FIGS. 1 and 2.

As shown in FIG. 1, in the semiconductor wafer SW, the stopper insulating film SIF, and the interlayer insulating film ILD1 in the TSV formation region, formed is a via (a through hole, a connection hole, or an opening) that penetrates them in a thickness direction.

This via is configured by a small-diameter via (a first via: a through hole; a connection hole; or an opening) VI1, and a large-diameter via (a second via: a through hole; a connection hole; or an opening) VI2 having a larger diameter (a diameter or an inner diameter) than a diameter of the small-diameter via VI1, the small-diameter via VI1 is arranged on a main surface S1 side of the semiconductor wafer SW, and the large-diameter via VI2 is arranged on a back surface (the second main surface) S2 side of the semiconductor wafer SW. Namely, the small-diameter via VI1 penetrates from an upper surface to a lower surface of each of the interlayer insulating film ILD1 and the stopper insulating film SIF, is further formed to have a predetermined depth from the main surface S1 of the semiconductor wafer SW, and the large-diameter via VI2 is formed to have a predetermined depth from the back surface S2 of the semiconductor wafer SW.

The diameter (a first diameter) of the small-diameter via VI1 is, for example, approximately 2 µm, and a depth thereof is, for example, approximately 10 µm. The diameter (a second diameter) of the large-diameter via VI2 is, for example, approximately 10 µm, and a depth thereof is, for example, approximately 43 µm.

In addition, a first insulating film IF1, for example, constituted of silicon oxide (SiO$_2$) is formed on a side surface of the small-diameter via VI1. Furthermore, a small-diameter through electrode (a first through electrode) TE1 constituted of a copper (Cu)-plated film is formed inside the small-diameter via VI1 via a barrier metal film BM1. The first insulating film IF1 functions as a protection film that prevents metal contamination from the small-diameter through electrode TE1, and also fulfills a function to insulate and separate the small-diameter through electrode TE1 from the semiconductor wafer SW. A thickness of the first insulating film IF1 is, for example, approximately 0.1 µm. The barrier metal film BM1 is, for example, a tantalum (Ta) film, and a thickness thereof is, for example, approximately 10 nm.

In addition, a second insulating film IF2, for example, constituted of silicon oxide (SiO$_2$) is formed on a side surface of the large-diameter via VI2. Furthermore, a large-diameter through electrode (a second through electrode) TE2 constituted of the copper (Cu)-plated film is formed inside the large-diameter via VI2 via a barrier metal film BM2. The second insulating film IF2 functions as a protection film that prevents metal contamination from the large-diameter through electrode TE2, and also fulfills a function to insulate and separate the large-diameter through electrode TE2 from the semiconductor wafer SW. A thickness of the second insulating film IF2 is, for example, approximately 0.2 µm. The barrier metal film BM2 is, for example, a tantalum (Ta) film, and a thickness thereof is, for example, approximately 25 nm.

A lower surface (surface on the back surface S2 side of the semiconductor wafer SW) of the small-diameter through electrode TE1 is located closer to the back surface S2 side of the semiconductor wafer SW than a bottom surface of large-diameter via VI2. Namely, a part of the small-diameter through electrode TE1 projects inside the large-diameter via VI2.

Although the tantalum (Ta) film has been exemplified as the barrier metal films BM1 and BM2, the present invention is not limited to this and, for example, a titanium (Ti) film, a cobalt (Co) film, a ruthenium (Ru) film, a titanium nitride (TiN) film, or a tantalum nitride (TaN) film can also be used.

The through electrode is configured by the small-diameter through electrode TE1 and the large-diameter through electrode TE2, and the lower surface (surface on the back surface S2 side of the semiconductor wafer SW) of the small-diameter through electrode TE1 and an upper surface (surface on the main surface S1 side of the semiconductor wafer SW) of the large-diameter through electrode TE2 are electrically coupled to each other via the barrier metal films BM1 and BM2.

However, a flat surface area and a diameter (a first diameter) of the small-diameter through electrode TE1 in a surface parallel to the main surface S1 of the semiconductor wafer SW are smaller than a flat surface area and a diameter (a second diameter) of the large-diameter through electrode TE2 in the surface parallel to the main surface S1 of the semiconductor wafer SW, respectively. Additionally, the small-diameter through electrode TE1 is arranged inside the large-diameter through electrode TE2 in a planar view, and a center position (a center 1 indicated by a long dashed dotted line in FIG. 1) of the small-diameter through electrode TE1 and a center position (a center 2 indicated by a long dashed dotted line in FIG. 1) of the large-diameter through electrode TE2 do not coincide with each other in the planar view. Namely, the center position of the small-diameter through electrode TE1 is away from the center position of the large-diameter through electrode TE2 in the planar view.

As mentioned above, distortion is generated in the semiconductor wafer SW on peripheries of the small-diameter through electrode TE1 and the large-diameter through electrode TE2 due to a difference in thermal expansion coefficients between copper (Cu) constituting the small-diameter through electrode TE1 and the large-diameter through electrode TE2, and silicon (Si) constituting the semiconductor wafer SW. However, the small-diameter through electrode TE1 with a smaller diameter than the large-diameter through electrode TE2, i.e., the small-diameter through electrode TE1 with a smaller volume is formed on the main surface S1 side of the semiconductor wafer SW. As a result of this, as compared with a case where the large-diameter through electrode TE2 is formed also on the main surface S1 side of the semiconductor wafer SW (refer to the above-mentioned FIG. 23), on the main surface S1 side of the semiconductor wafer SW, a range where distortion is generated becomes smaller, and a region that the through electrode occupies becomes smaller.

Accordingly, in the First Embodiment, the region (region (keep out zone) where arrangement of the semiconductor elements is limited) of the semiconductor wafer SW affected by the distortion becomes small, and thus a region where the semiconductor elements can be arranged can be increased by an amount corresponding to a decreased region of the semiconductor wafer SW affected by the distortion. Furthermore, since a position where the small-diameter through electrode TE1 is formed can be adjusted in a range capable of being coupled to the large-diameter through electrode TE2, the position of the small-diameter through electrode TE1 can be set in accordance with arrangement of the semiconductor elements. Consequently, high integration of the semiconductor elements can be achieved, and a degree of freedom of arrangement of the semiconductor elements also becomes high.

In addition, when the region that the through electrode (small-diameter through electrode TE1) occupies on the main surface S1 side of the semiconductor wafer SW becomes small, a flat surface area of the coupling pad MC coupled to the through electrode can also be made small, and thus a region where the first-layer wiring M1 can be arranged becomes large, and a degree of freedom of arrangement of the first-layer wiring M1 becomes high.

An upper surface (surface on the main surface S1 side of the semiconductor wafer SW) of the small-diameter through electrode TE1 is coupled to the coupling pad MC in the same layer as the first-layer wiring M1 via the barrier metal film. The coupling pad MC is formed by forming a coupling pad formation trench TRb in the interlayer insulating film ILD2, and burying the copper (Cu) film inside the coupling pad formation trench TRb.

In the First Embodiment, although the coupling pad MC is exemplified as a layer to which the upper surface of the through electrode (small-diameter through electrode TE1) is coupled, the present invention is not limited to this, and the layer may be a wiring (for example, a wiring formed in a stripe shape or a lattice shape) formed in the same layer as the first-layer wiring M1.

An insulating film (a third insulating film) IF3 is formed at the back surface S2 of the semiconductor wafer SW. This insulating film IF3 functions also as a protection film that prevents metal contamination from the back surface S2 of the semiconductor wafer SW. The insulating film IF3 is, for example, a stacked film of a silicon nitride ($Si_3N_4$) film, a silicon oxide ($SiO_2$) film, or a silicon nitride ($Si_3N_4$) film and a silicon oxide ($SiO_2$) film.

Furthermore, a lower surface (surface on the back surface S2 side of the semiconductor wafer SW) of the large-diameter through electrode TE2 is exposed at the back surface S2 of the semiconductor wafer SW. A barrier metal film BM3 is formed, coupled to the lower surface of the large-diameter through electrode TE2, and a copper (Cu) sheet layer CS and a back surface bump RB are formed, coupled to the barrier metal film BM3. The barrier metal film BM3 is, for example, a titanium (Ti) film, a tantalum (Ta) film, a cobalt (Co) film, a ruthenium (Ru) film, a titanium nitride (TiN) film, or a tantalum nitride (TaN) film. In addition, the back surface bump RB is constituted of a stacked film in which copper (Cu), nickel (Ni), and Au (gold) have been formed as films sequentially from a copper (Cu) sheet layer CS side.

A size of a region where the plurality of through electrodes TE constituted of the small-diameter through electrodes TE1 and the large-diameter through electrodes TE2 are formed is defined by standards to keep connection with general-purpose products, such as a memory. For example, as shown in FIG. 2, in a semiconductor chip (semiconductor device) SC of a size of 6 by 6 mm in height and width, arranged are four TSV formation regions ATSV where fifty through electrodes in height and six through electrodes in width are arranged at 40 μm pitch in a center of the semiconductor chip SC. Namely, the center of the semiconductor chip SC is the TSV formation region ATSV where the plurality of through electrodes is formed, and the other region corresponds to an element formation region where the plurality of semiconductor elements is formed. It is to be noted that although the TSV formation regions ATSV are provided in the center of the semiconductor chip SC in FIG. 2, a position where the TSV formation regions ATSV are provided is not limited to the center.

In addition, not all the plurality of through electrodes formed in the TSV formation region ATSV need not be configured by the through electrode in which the center position of the small-diameter through electrode TE1 and the center position of the large-diameter through electrode TE2 do not overlap with each other in the planar view. Namely, all of the through electrodes formed in the TSV formation region ATSV may be configured by the through electrode in which the center position of the small-diameter through electrode TE1 and the center position of the large-diameter through electrode TE2 do not overlap with each other in the planar view. Alternatively, a part of the through electrodes formed in the TSV formation region ATSV may be configured by the through electrode in which the center position of the small-diameter through electrode TE1 and the center position of the large-diameter through electrode TE2 do not overlap with each other in the planar view, and the other through electrodes may be configured by the through electrode in which the center position of the small-diameter through electrode TE1 and the center position of the large-diameter through electrode TE2 overlap with each other in the planar view.

<<Method of Manufacturing Semiconductor Device>>

Next, a method of manufacturing a semiconductor device employing TSV technology according to the present First Embodiment will be explained in step order using FIGS. 3 to 17. FIGS. 3 to 17 are main part cross-sectional views of the semiconductor device during manufacturing steps of the semiconductor device, and respectively show a part of the element formation region and a part of the TSV formation region. In addition, the nMISFET is exemplified as the semiconductor element in the element formation regions of FIGS. 3 to 17. In addition, although, for example, not less than a hundred through electrodes are formed in the semiconductor device, for convenience, one through electrode constituted of a small-diameter through electrode and a large-diameter through electrode, and a periphery thereof will be described in FIGS. 3 to 17.

<Formation Step of Semiconductor Element>

Figure 3:
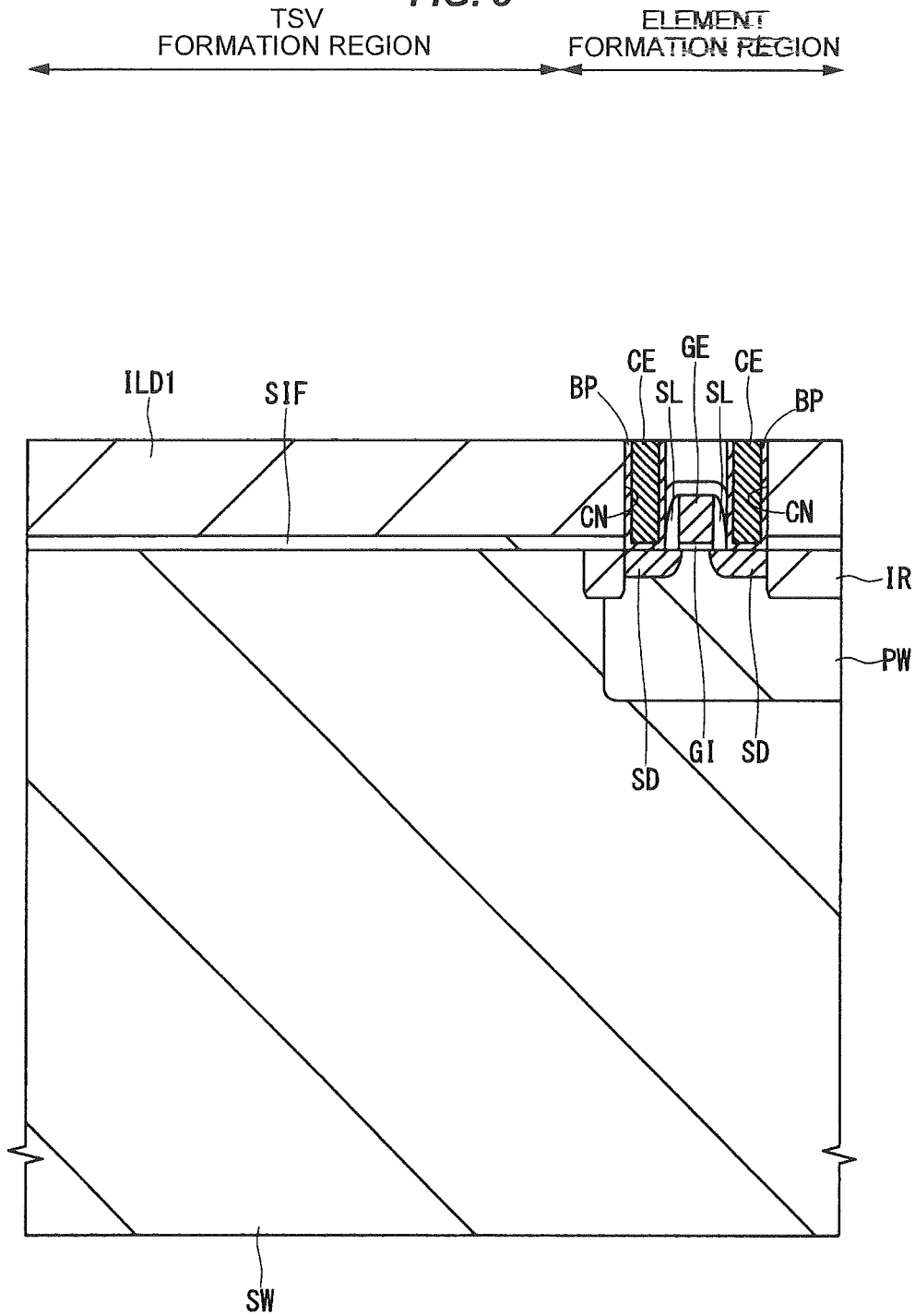
FIG. 3 is an enlarged main part cross-sectional view showing a part of the semiconductor device during a manufacturing step of the semiconductor device according to the First Embodiment.

First, as shown in FIG. 3, for example, prepared is the semiconductor wafer (semiconductor thin plate referred to as the wafer whose flat surface is substantially circular) SW constituted of single crystal silicon (Si). The thickness (the first thickness) of the semiconductor wafer SW is, for example, approximately 700 μm. Next, the isolation portion IR constituted of the insulating film is formed in an element isolation region of the main surface (the surface or the first main surface) of the semiconductor wafer SW. Subsequently, impurities indicating p-type conductivity are ion-implanted in the semiconductor wafer SW in the region where the nMISFET is formed to form the p-type well PW.

Next, after the gate insulating film GI of the nMISFET is formed on the main surface of the semiconductor wafer SW, the gate electrode GE of the nMISFET is formed on the gate insulating film GI. Subsequently, after the sidewall SL is formed on the side surface of the gate electrode GE, impurities indicating n-type conductivity are ion-implanted in the p-type well PW on both sides of the gate electrode GE, and the n-type semiconductor regions SD that function as the source and the drain of the nMISFET are formed in a self-aligned manner with respect to the gate electrode GE and the sidewall SL.

Subsequently, the stopper insulating film SIF and the interlayer insulating film ILD1 are sequentially formed on the main surface of the semiconductor wafer SW. The stopper insulating film SIF is the film serving as an etching stopper when the interlayer insulating film ILD1 is processed, and a material having an etching selectivity with respect to the interlayer insulating film ILD1 is used therefor. The stopper insulating film SIF is, for example, a silicon nitride ($Si_3N_4$) film, and the interlayer insulating film ILD1 is, for example, a silicon oxide ($SiO_2$) film.

Next, by dry etching in which a resist pattern is used as a mask, the interlayer insulating film ILD1 and the stopper insulating film SIF are sequentially processed to form the connection holes CN in the element formation region. The connection holes CN are formed in portions that require voltage application to operate the nMISFETs on the n-type semiconductor regions SD and the gate electrode GE, etc.

Subsequently, the barrier metal film BP is formed on the main surface of the semiconductor wafer SW, for example, by a sputtering method. The barrier metal film BP is, for example, a titanium (Ti) film, a tantalum (Ta) film, a titanium nitride (TiN) film, or a tantalum nitride (TaN) film, and a thickness thereof is, for example, approximately 0.1 μm. Subsequently, a tungsten (W) film is formed on the barrier metal film BP, for example, by the CVD method or the sputtering method. Subsequently, the tungsten (W) film and the barrier metal film BP in a region other than insides of the connection holes CN are removed by the CMP method, and the coupling electrodes (plugs) CE constituted of the tungsten (W) film are formed inside the connection holes CN.

<Formation Step of Small-Diameter Through Electrode>

Figure 4:
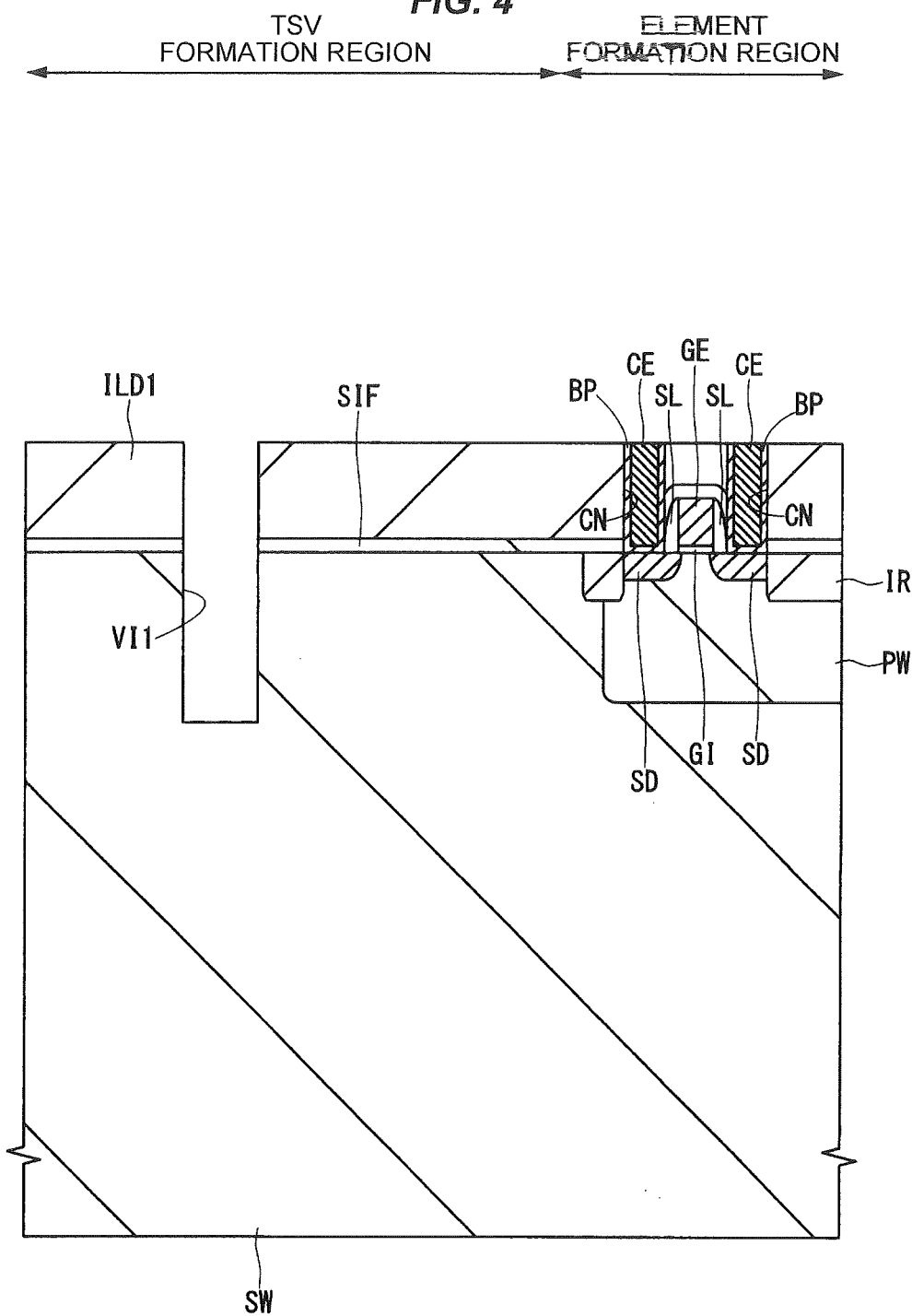
FIG. 4 is a main part cross-sectional view of a same portion as in FIG. 3 during a manufacturing step of the semiconductor device subsequent to FIG. 3.

Next, as shown in FIG. 4, the interlayer insulating film ILD1, the stopper insulating film SIF, and the semiconductor wafer SW in the TSV formation region are sequentially etched by using the resist pattern as a mask to form the small-diameter via (the first via: the through hole; the connection hole; or the opening) VI1 in the interlayer insulating film ILD1, the stopper insulating film SIF, and the semiconductor wafer SW. The diameter (the first diameter: the diameter; or the inner diameter) of the small-diameter via VI1 is, for example, approximately 2 μm, and the depth thereof is, for example, approximately 10 μm.

Figure 5:
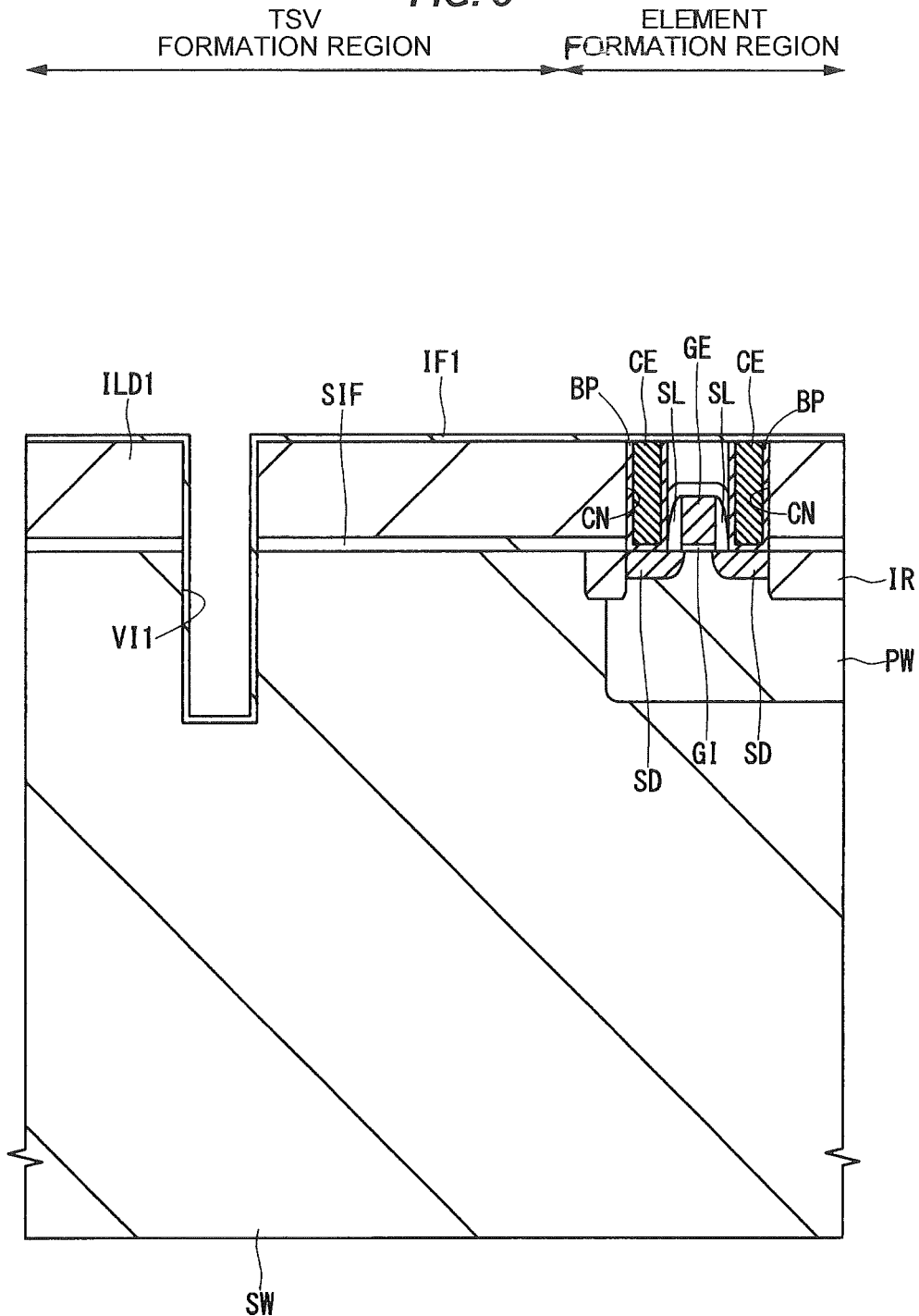
FIG. 5 is a main part cross-sectional view of the same portion as in FIG. 3 during a manufacturing step of the semiconductor device subsequent to FIG. 4.
Figure 6:
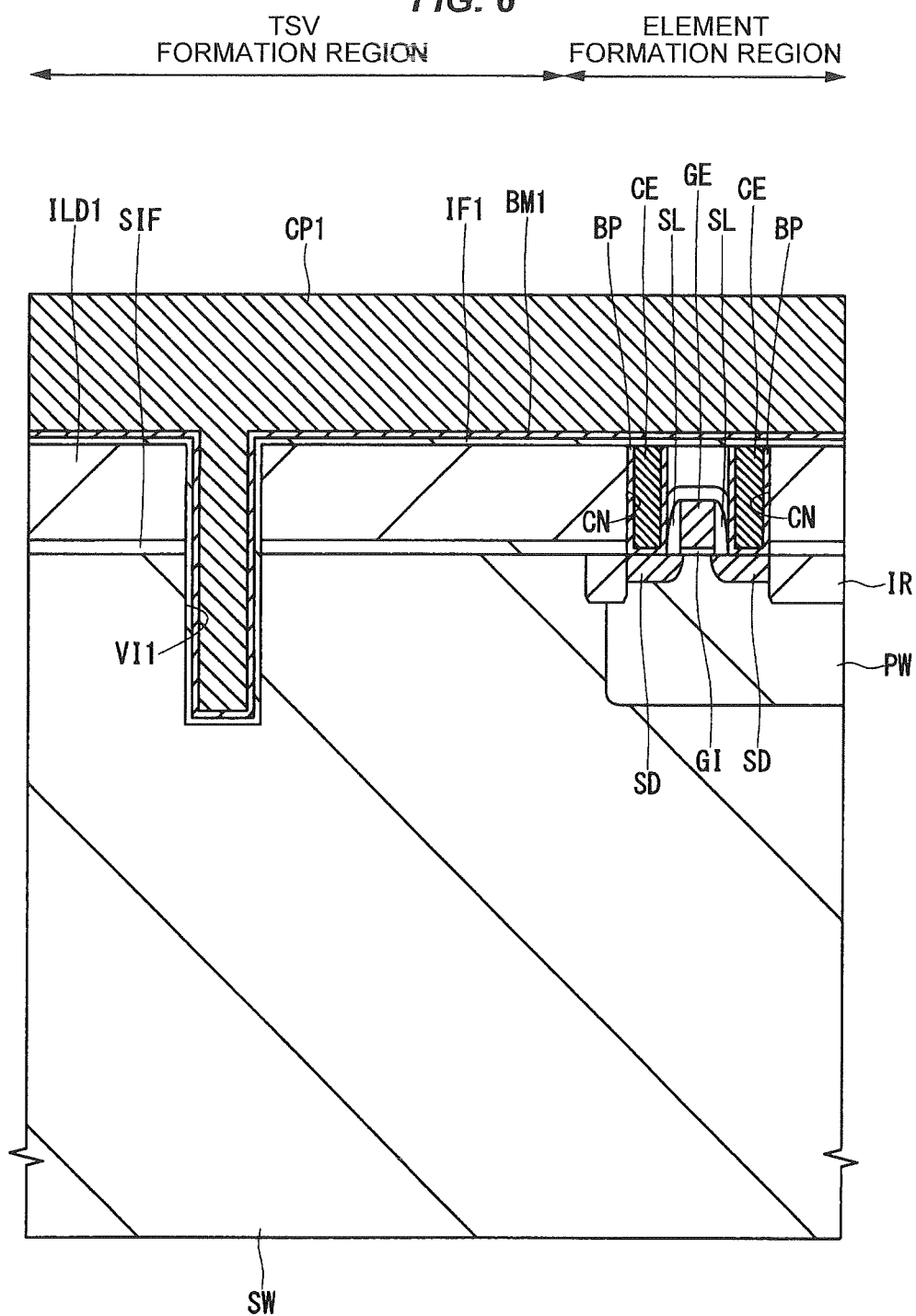
FIG. 6 is a main part cross-sectional view of the same portion as in FIG. 3 during a manufacturing step of the semiconductor device subsequent to FIG. 5.

Subsequently, as shown in FIG. 5, the first insulating film IF1 is formed on the main surface of the semiconductor wafer SW including a bottom surface and the side surface of the small-diameter via V1. The first insulating film IF1 is a silicon oxide ($SiO_2$) film formed, for example, by a plasma CVD method, and a thickness thereof is, for example, approximately 0.1 μm.

Next, after the barrier metal film BM1 is formed on the main surface of the semiconductor wafer SW (on the first insulating film IF1), a copper (Cu) seed layer (illustration is omitted) is formed on the barrier metal film BM1, and a copper (Cu)-plated film CP1 is further formed on the seed layer using an electrolytic plating method. Since the diameter of the small-diameter via VI1 is relatively small, for example, approximately 2 μm, but an aspect ratio thereof is approximately 5, the copper (Cu)-plated film CP1 can be buried inside the small-diameter via VI1 by the electrolytic plating method. The barrier metal film BM1 is, for example, a titanium (Ti) film, a tantalum (Ta) film, a cobalt (Co) film, a ruthenium (Ru) film, a titanium nitride (TiN) film, or a tantalum nitride (TaN) film, and a thickness thereof is, for example, approximately 10 nm.

Figure 7:
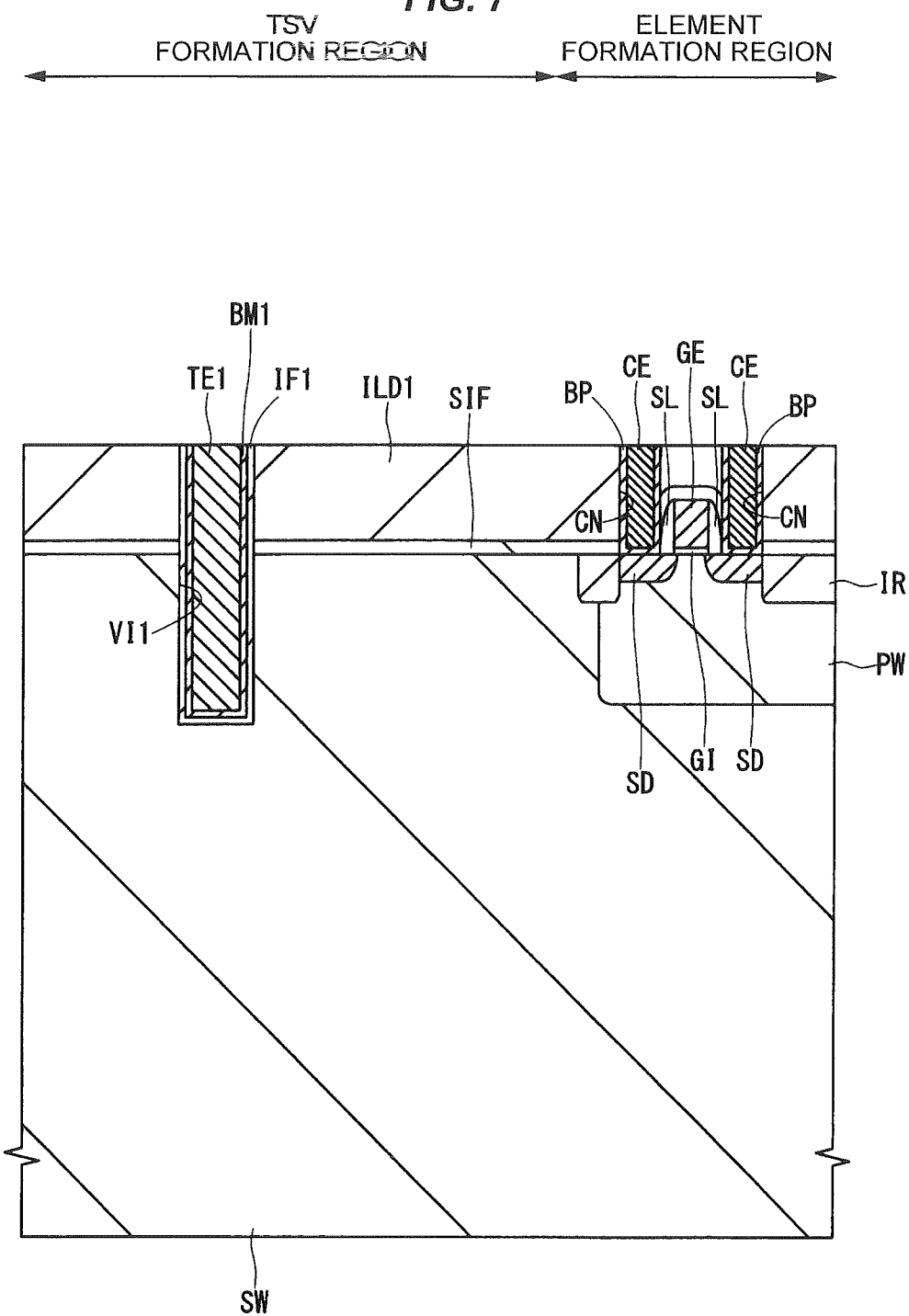
FIG. 7 is a main part cross-sectional view of the same portion as in FIG. 3 during a manufacturing step of the semiconductor device subsequent to FIG. 6.

Next, as shown in FIG. 7, the copper (Cu)-plated film CP1, the seed layer, the barrier metal film BM1, and the first insulating film IF1 in a region other than an inside of the small-diameter via VI1 are removed by the CMP method to form the small-diameter through electrode (the first through electrode) TE1 constituted of the copper (Cu) film inside the small-diameter via VI1.

<Formation Step of Multi-layer Wiring and External Terminal>

Figure 8:
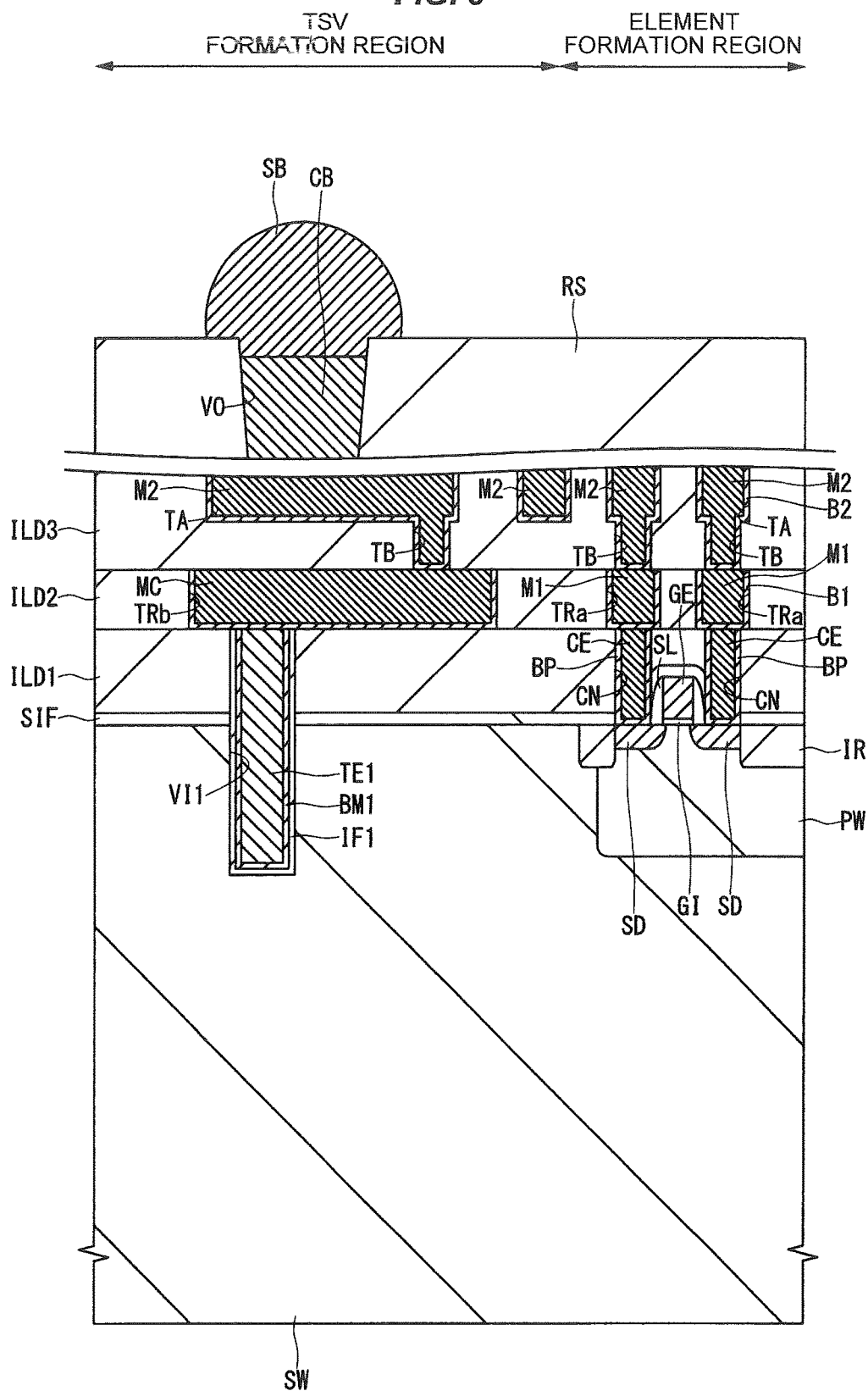
FIG. 8 is a main part cross-sectional view of the same portion as in FIG. 3 during a manufacturing step of the semiconductor device subsequent to FIG. 7.

Next, as shown in FIG. 8, the first-layer wirings M1, the coupling pad MC, the second-layer wirings M2, the copper (Cu) bump CB, and the external terminal (solder ball) SB are sequentially formed on the main surface side of the semiconductor wafer SW.

First, the first-layer wirings M1 are formed in the element formation region by the single damascene method, and the coupling pad MC is formed in the TSV formation region.

The interlayer insulating film ILD2 is formed on the main surface of the semiconductor wafer SW. The interlayer insulating film ILD2 is a silicon oxide ($SiO_2$) film formed, for example, by the plasma CVD method. Subsequently, the interlayer insulating film ILD2 is dry-etched using the resist pattern as a mask to form the wiring formation trenches TRa that penetrate from an upper surface to a lower surface of the interlayer insulating film ILD2, and that reach coupling electrodes CE in a region of the element formation region where the first-layer wirings M1 are formed. Simultaneously, the coupling pad formation trench TRb that penetrates from the upper surface to the lower surface of the interlayer insulating film ILD2, and that reaches the small-diameter through electrode TE1 is formed in a region of the TSV formation region where the coupling pad MC is formed.

Subsequently, a barrier metal film B1 is formed on the main surface of the semiconductor wafer SW. The barrier metal film B1 is, for example, a titanium (Ti) film, a tantalum (Ta) film, a titanium nitride (TiN) film, or a tantalum nitride (TaN) film. Subsequently, a copper (Cu) seed layer (illustration is omitted) is formed on the barrier metal film B1 by the CVD method or the sputtering method, and a copper (Cu)-plated film (illustration is omitted) is further formed on the seed layer using the electrolytic plating method. Insides of the wiring formation trenches TRa and the coupling pad formation trench TRb are buried by the copper (Cu)-plated film.

Subsequently, the copper (Cu)-plated film, the seed layer, and the barrier metal film B1 in a region other than the insides of the wiring formation trenches TRa and the coupling pad formation trench TRb are removed by the CMP method. As a result of this, the first-layer wirings M1 constituted of the copper (Cu) film are formed inside the wiring formation trenches TRa. Simultaneously, the coupling pad MC constituted of the copper (Cu) film is formed inside the coupling pad formation trench TRb. It is to be noted that although the copper (Cu) film constituting the first-layer wirings M1 and the coupling pad MC is formed by the electrolytic plating method in the First Embodiment, it may be formed by the CVD method, the sputtering method, a sputter reflow method or the like.

Next, the second-layer wirings M2 are formed in the element formation region and the TSV formation region by the dual damascene method.

The interlayer insulating film ILD3 is formed on the main surface of the semiconductor wafer SW, for example, by the plasma CVD method. The interlayer insulating film ILD3 is formed after respective surface shapes of the interlayer insulating film ILD2, the first-layer wirings M1, and the coupling pad MC that are located in a lower layer of the interlayer insulating film ILD3, surfaces thereof are substantially flat, and thus a surface of the interlayer insulating film ILD3 is also substantially flat. Subsequently, the interlayer insulating film ILD3 is dry-etched using the resist pattern as a mask to form the wiring formation trenches TA in a region where the second-layer wirings M2 are formed. Furthermore, the connection holes TB that reach the first-layer wirings M1 are formed in portions linking the wiring formation trenches TA and the first-layer wirings M1. Simultaneously, the connection hole TB that reaches the coupling pad MC is formed in a portion linking the wiring formation trenches TA and the coupling pad MC.

Subsequently, after a barrier metal film B2 is formed on the main surface of the semiconductor wafer SW, a copper (Cu) seed layer (illustration is omitted) is formed on the barrier metal film B2, and a copper (Cu)-plated film (illustration is omitted) is further formed on the seed layer using the electrolytic plating method. The barrier metal film B2 is a single layer film, such as a titanium (Ti) film, a tantalum (Ta) film, a titanium nitride (TiN) film, or a tantalum nitride (TaN) film, or a stacked film in which some of these films are stacked.

Subsequently, the copper (Cu)-plated film, the seed layer, and the barrier metal film B2 in a region other than the insides of the wiring formation trenches TA and the connection holes TB are removed by the CMP method, the second-layer wirings M2 constituted of the copper (Cu) film are formed inside the wiring formation trenches TA, and the coupling components formed integrally with the second-layer wirings M2 are formed inside the connection holes TB.

After that, although upper layer wirings are further formed similarly to the above-mentioned first-layer wiring M1 or the second-layer wirings M2, explanation here is omitted.

Next, the copper (Cu) bump CB and the external terminal (solder ball) SB are formed.

An insulating film (illustration is omitted) and the sealing resin RS are formed on the main surface side of the semiconductor wafer SW so as to cover top-layer wirings (for example, the sixth-layer wirings M6 shown in the above-mentioned FIG. 1). Subsequently, after the opening VO that reaches the top-layer wirings is formed in the insulating film and the sealing resin RS, the copper (Cu) bump CB is formed so as to bury this opening VO using the electrolytic plating method.

Subsequently, the external terminal (solder ball) SB is coupled to the copper (Cu) bump CB exposed from the opening VO. The external terminal SB is formed, for example, by applying heat treatment after a ball-shaped soldering agent is supplied by a ball supply method.

<Formation Step of Large-diameter Through Electrode>

Figure 9:
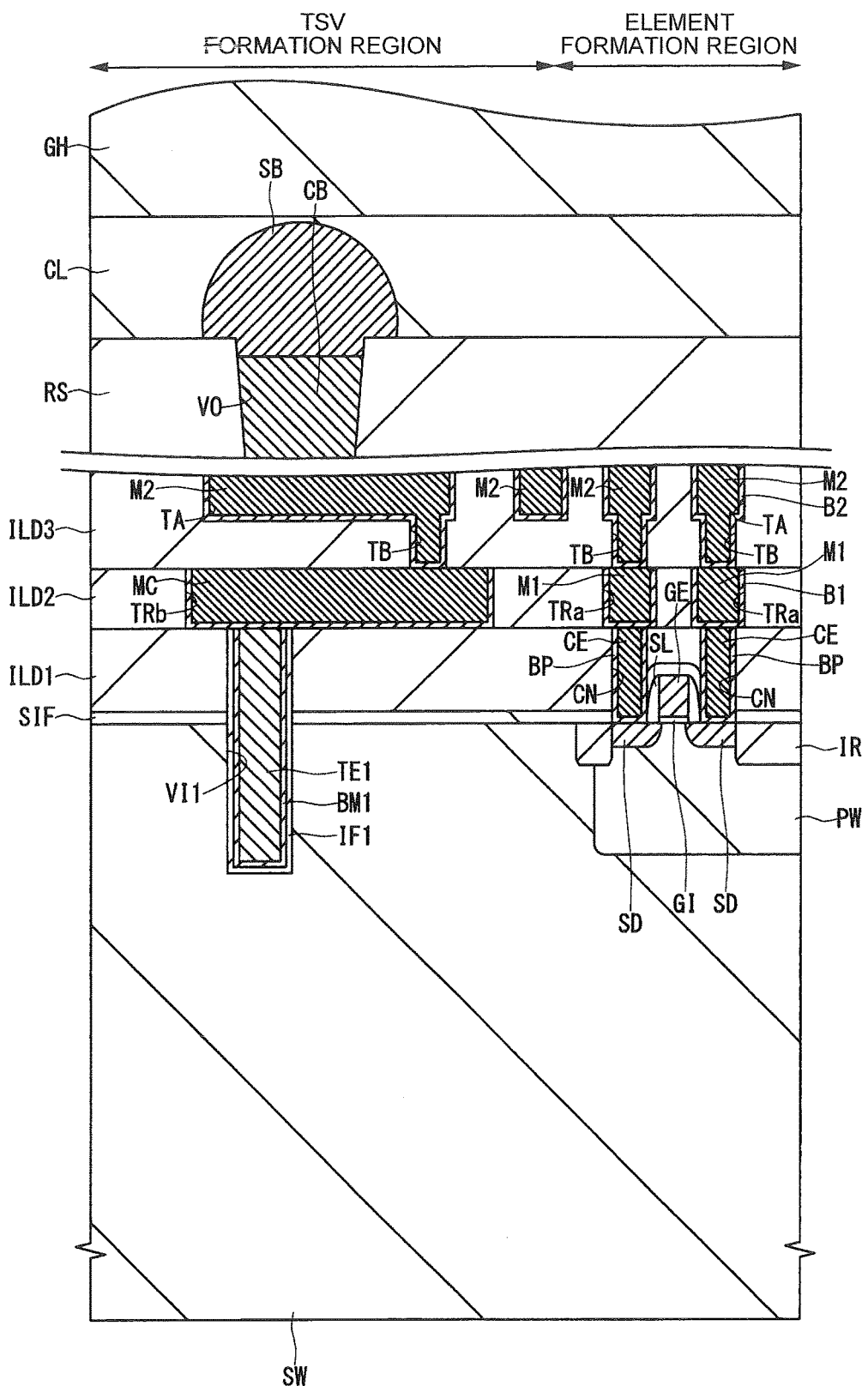
FIG. 9 is a main part cross-sectional view of the same portion as in FIG. 3 during a manufacturing step of the semiconductor device subsequent to FIG. 8.

Next, as shown in FIG. 9, a glass support body GH is bonded on the main surface side of the semiconductor wafer SW via an adhesive layer CL.

Figure 10:
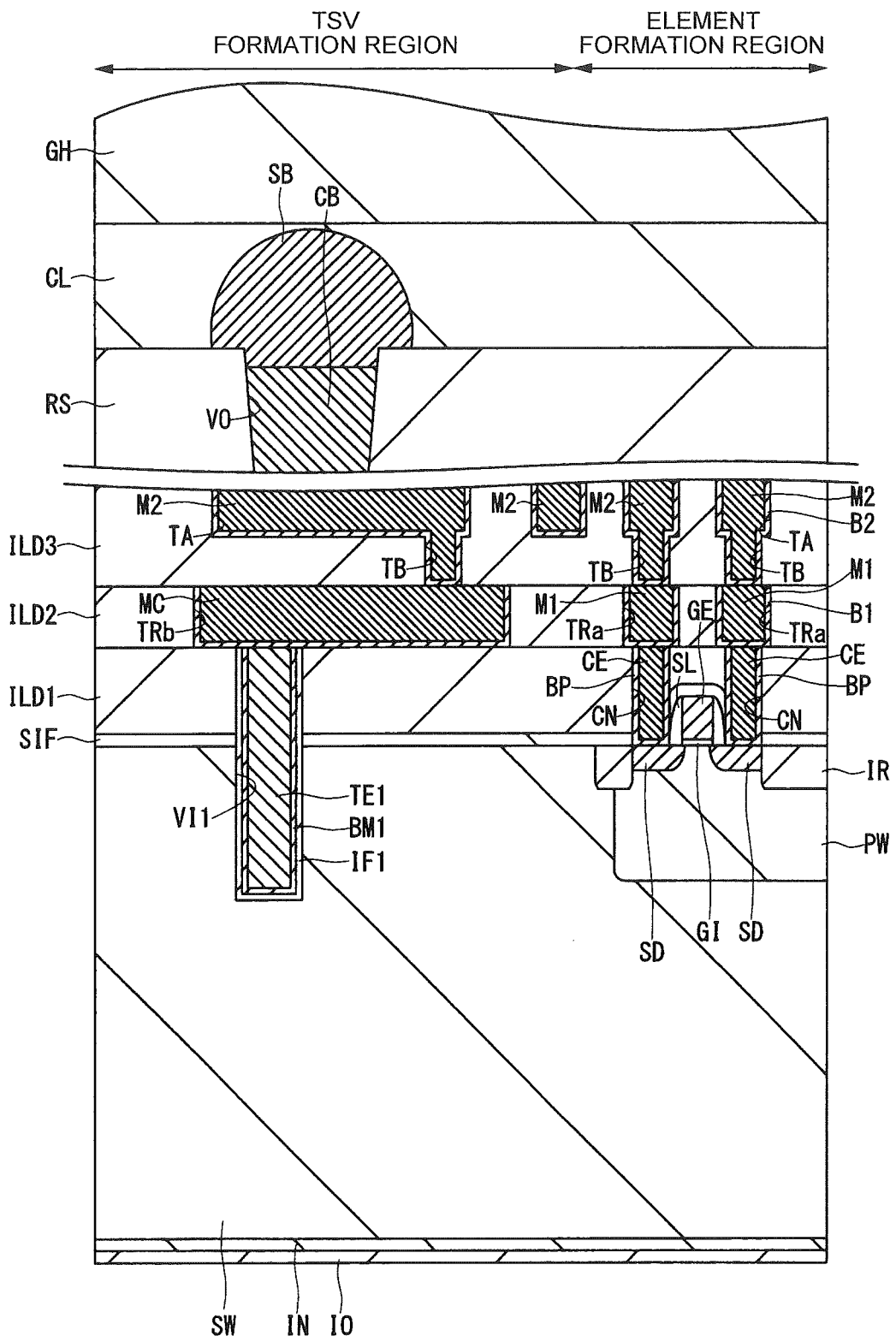
FIG. 10 is a main part cross-sectional view of the same portion as in FIG. 3 during a manufacturing step of the semiconductor device subsequent to FIG. 9.

Next, as shown in FIG. 10, a back surface (a second main surface) on an opposite side of the main surface of the semiconductor wafer SW is grinded, polished, or etched back to make a thickness (a second thickness) of the semiconductor wafer SW to be, for example, not more than 50 μm. At this time, the small-diameter through electrode TE1 does not project from the back surface of the semiconductor wafer SW.

Next, the insulating film (the third insulating film indicated by a symbol IF3 in FIG. 1), for example, a silicon nitride ($Si_3N_4$) film IN and a silicon oxide ($SiO_2$) film IO are sequentially formed on the back surface of the semiconductor wafer SW. Since this film formation needs to be performed at a temperature not more than a heatproof temperature of the adhesive layer CL that has made the glass support body GH adhere, the silicon nitride ($Si_3N_4$) film IN and the silicon oxide ($SiO_2$) film IO are formed, for example, by the plasma CVD method or a gas cluster ion beam method.

Figure 11:
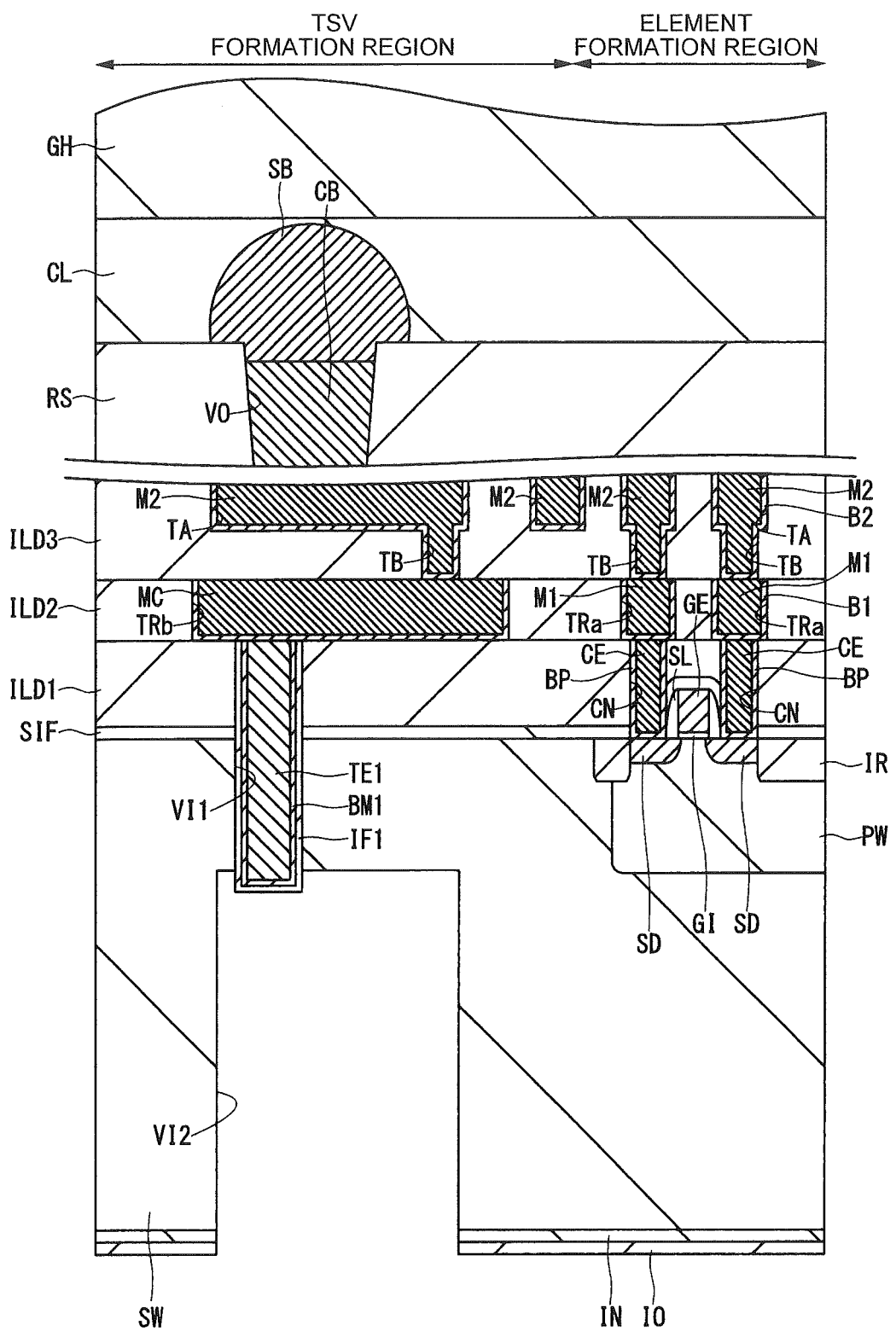
FIG. 11 is a main part cross-sectional view of the same portion as in FIG. 3 during a manufacturing step of the semiconductor device subsequent to FIG. 10.

Next, as shown in FIG. 11, the silicon oxide ($SiO_2$) film IO, the silicon nitride ($Si_3N_4$) film IN, and the semiconductor wafer SW in the TSV formation region are sequentially etched from the back surface side of the semiconductor wafer SW by using the resist pattern as a mask to form the large-diameter via (the second via: the through hole; the connection hole; or the opening) VI2 in the semiconductor wafer SW. The diameter (the second diameter: the diameter; or the inner diameter) of the large-diameter via VI2 is, for example, approximately 10 μm, and a depth thereof is, for example, approximately 43 μm.

At this time, a part of the small-diameter through electrode TE1 covered with the first insulating film IF1 and the barrier metal film BM1 projects from a part of the bottom surface of the large-diameter via VI2. Namely, the lower surface of the small-diameter through electrode TE1 is located closer to the back surface side of the semiconductor wafer SW than the bottom surface of the large-diameter via VI2. In addition, a center position of the small-diameter via VI1 and a center position of the large-diameter via VI2 do not coincide with each other in the planar view. Namely, the center position of the small-diameter via VI1 is away from the center position of the large-diameter via VI2 in the planar view.

Figure 12:
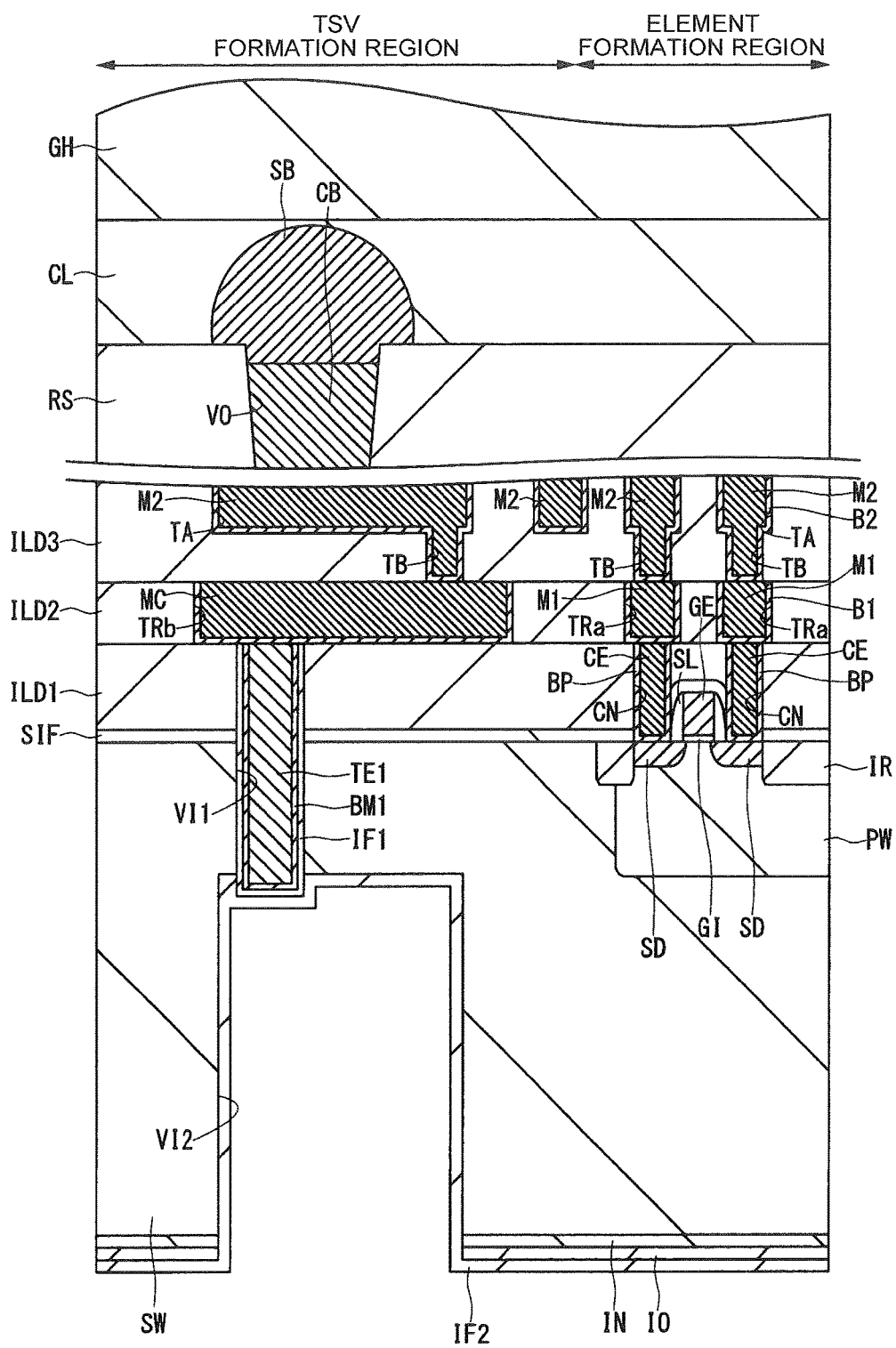
FIG. 12 is a main part cross-sectional view of the same portion as in FIG. 3 during a manufacturing step of the semiconductor device subsequent to FIG. 11.

Next, as shown in FIG. 12, the second insulating film IF2 is formed on the back surface of the semiconductor wafer SW so as to cover the bottom surface and the side surface of the large-diameter via VI2, and the part of the small-diameter through electrode TE1 (it is covered with the first insulating film IF1 and the barrier metal film BM1) exposed from the bottom surface of the large-diameter via VI2. The second insulating film IF2 is, for example, a plasma TEOS (Tetra Ethyl Ortho Silicate) film, and a thickness thereof is, for example, approximately 0.2 μ2.

Figure 13:
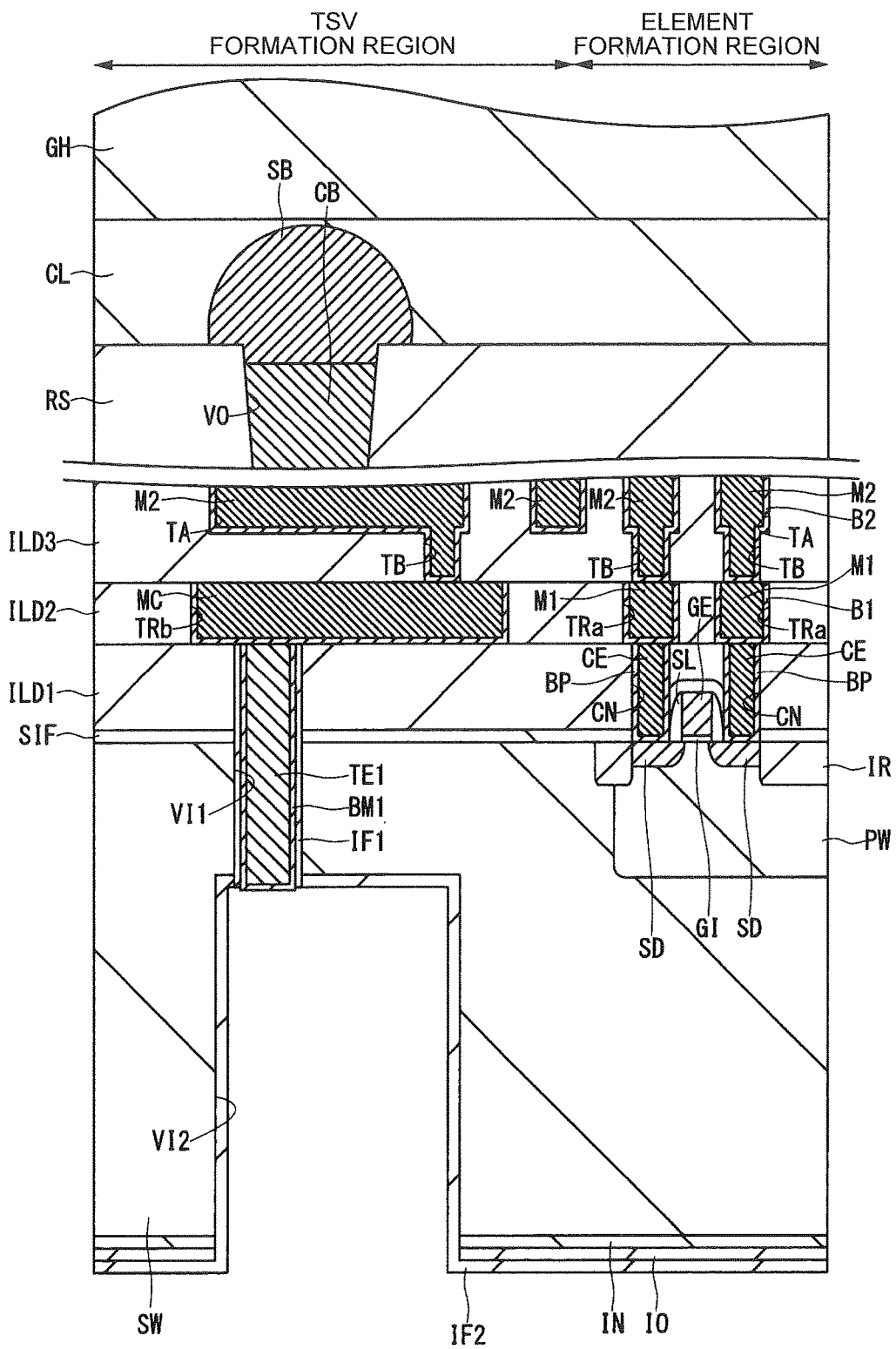
FIG. 13 is a main part cross-sectional view of the same portion as in FIG. 3 during a manufacturing step of the semiconductor device subsequent to FIG. 12.

Next, as shown in FIG. 13, the first insulating film IF1 and the second insulating film IF2 that cover the lower surface of the small-diameter through electrode TE1 are removed to expose the barrier metal film BM1 that covers the lower surface of the small-diameter through electrode TE1.

Figure 14:
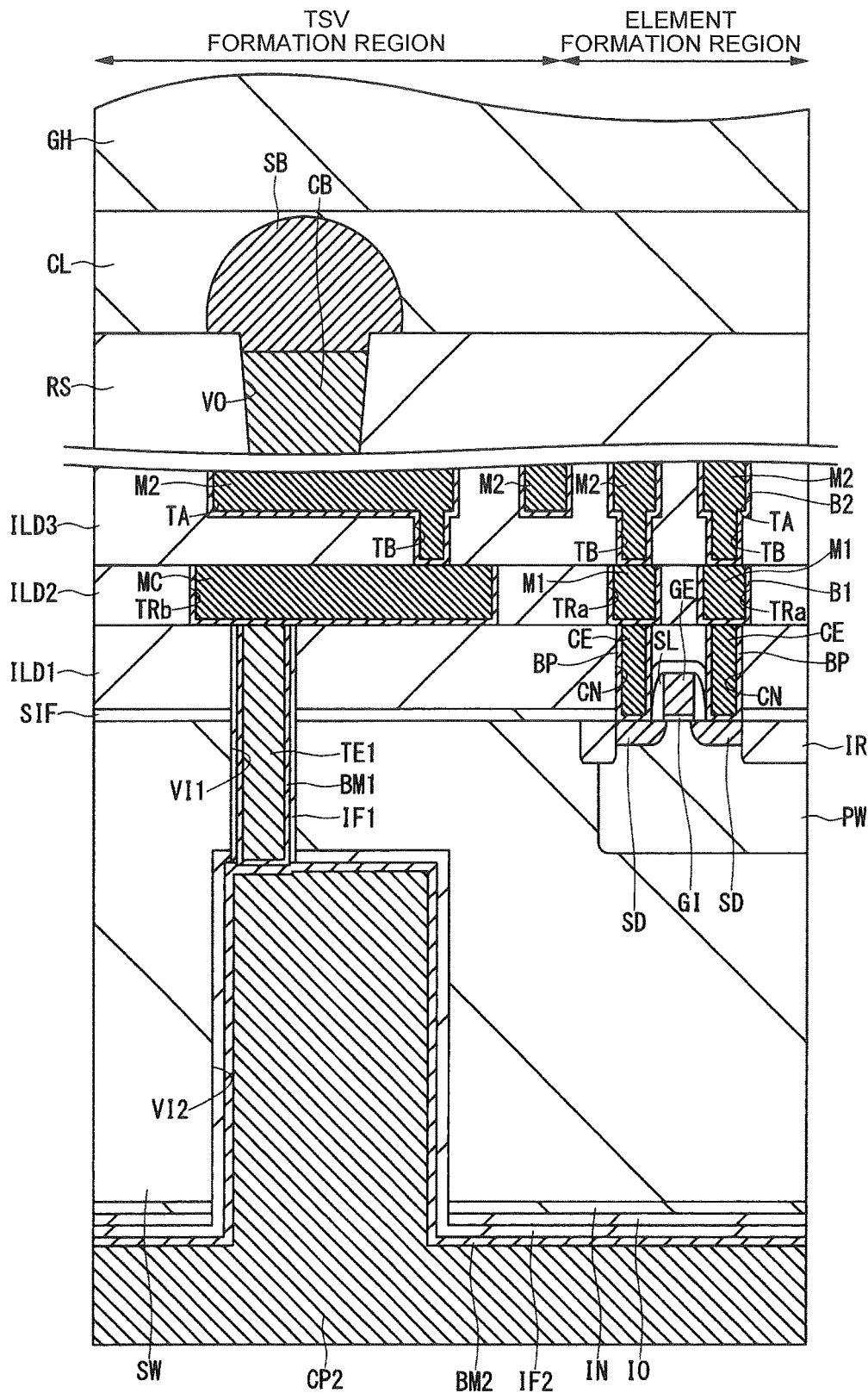
FIG. 14 is a main part cross-sectional view of the same portion as in FIG. 3 during a manufacturing step of the semiconductor device subsequent to FIG. 13.

Next, as shown in FIG. 14, the barrier metal film BM2 is formed on the back surface of the semiconductor wafer SW so as to cover the bottom surface and the side surface of the large-diameter via VI2, and the part of the small-diameter through electrode TE1 (it is covered with the barrier metal film BM1) exposed from the bottom surface of the large-diameter via VI2. Subsequently, a copper (Cu) seed layer (illustration is omitted) is formed on the barrier metal film BM2, and a copper (Cu)-plated film CP2 is further formed on the seed layer using the electrolytic plating method. The barrier metal film BM2 is a single layer film, such as a titanium (Ti) film, a tantalum (Ta) film, a cobalt (Co) film, a ruthenium (Ru) film, a nickel (Ni) film, a titanium nitride (TiN) film, or a tantalum nitride (TaN) film, or a stacked film thereof. Although the First Embodiment in a case of using the barrier metal film BM2 is described here, an insulating film having performance to prevent copper (Cu) diffusion to the semiconductor wafer SW, for example, a silicon nitride ($Si_3N_4$) film may be used instead of the barrier metal film BM2.

Figure 15:
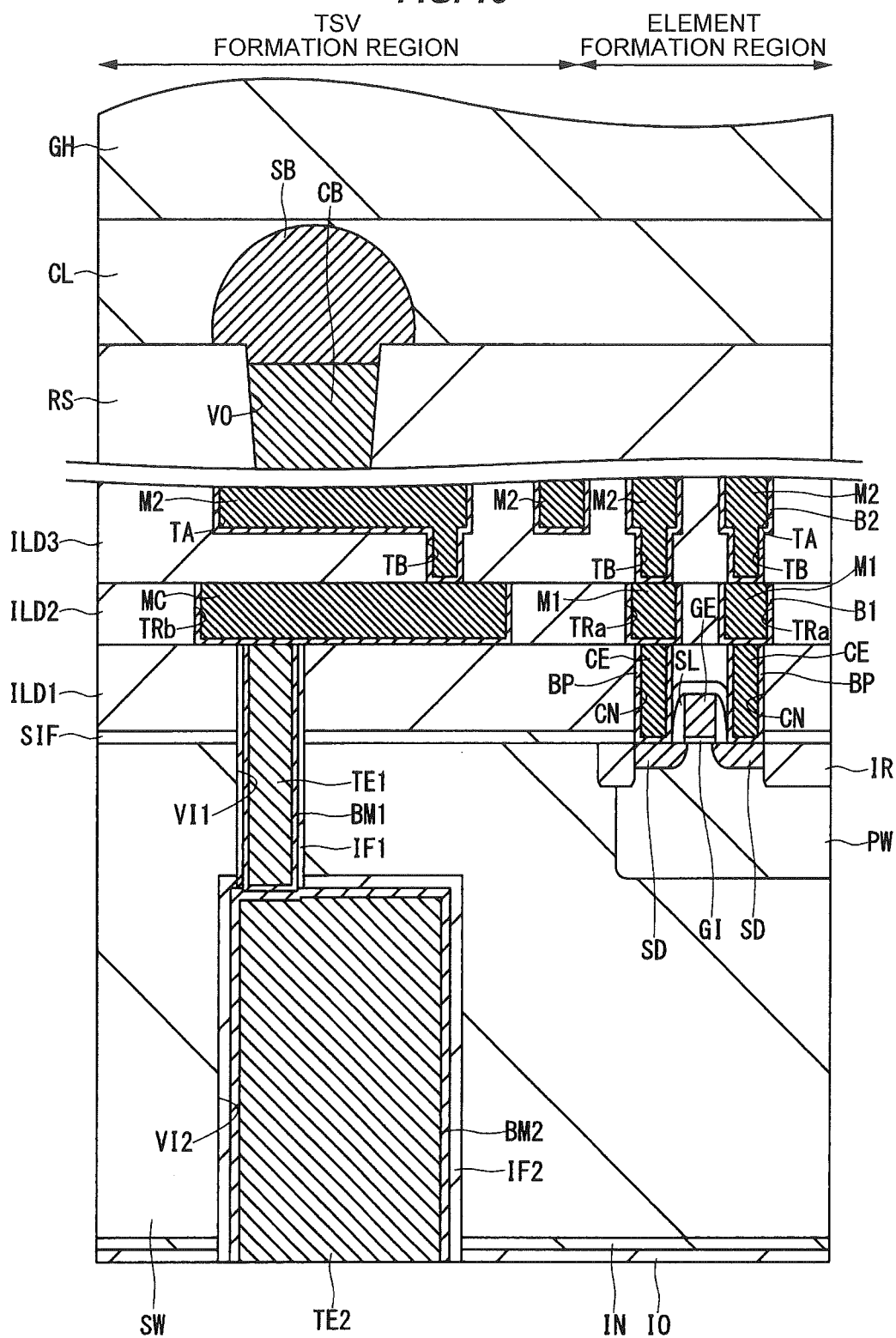
FIG. 15 is a main part cross-sectional view of the same portion as in FIG. 3 during a manufacturing step of the semiconductor device subsequent to FIG. 14.

Next, as shown in FIG. 15, the copper (Cu)-plated film CP2, the seed layer, and the barrier metal film BM2 in a region other than an inside of the large-diameter via VI2 are removed by the CMP method to form the large-diameter through electrode TE2 constituted of the copper (Cu) film inside the large-diameter via VI2. In this case, since the silicon nitride ($Si_3N_4$) film IN has been formed on the back surface of the semiconductor wafer SW, the back surface of the semiconductor wafer SW is not exposed. Consequently, diffusion of copper (Cu) constituting the large-diameter through electrode TE2 into the semiconductor wafer SW can be prevented, and change of the operation characteristics of the semiconductor elements due to copper (Cu) contamination can be suppressed.

Figure 16:
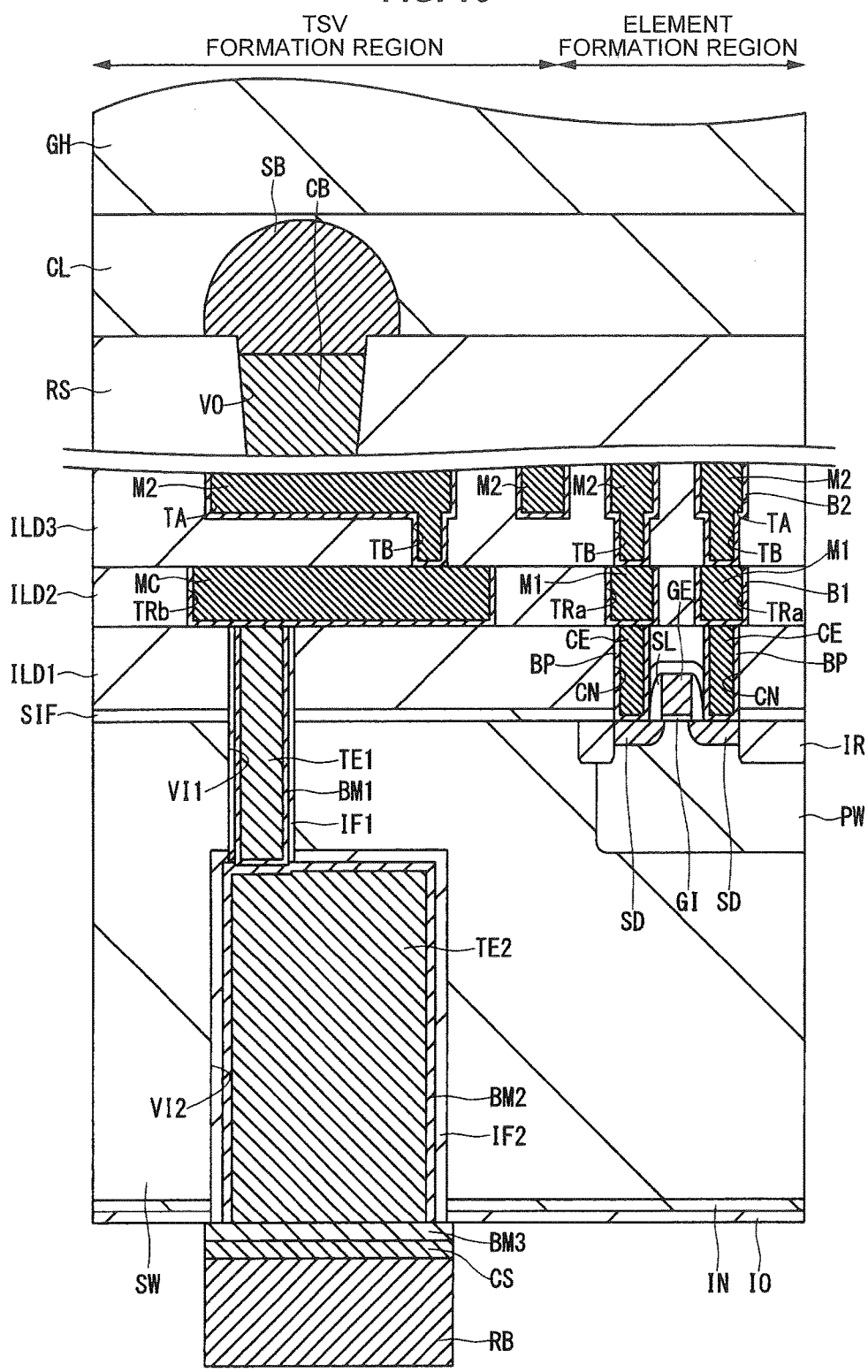
FIG. 16 is a main part cross-sectional view of the same portion as in FIG. 3 during a manufacturing step of the semiconductor device subsequent to FIG. 15.

Next, as shown in FIG. 16, the barrier metal film BM3, the copper (Cu) sheet layer CS, and the back surface bump RB are formed, coupled to the lower surface of the large-diameter through electrode TE2. The barrier metal film BM3 is, for example, a titanium (Ti) film, a tantalum (Ta) film, a cobalt (Co) film, a ruthenium (Ru) film, a titanium nitride (TiN) film, or a tantalum nitride (TaN) film. In addition, the back surface bump RB is constituted of the stacked film in which copper (Cu), nickel (Ni), and Au (gold) have been formed as films sequentially from the copper (Cu) sheet layer CS side.

Figure 17:
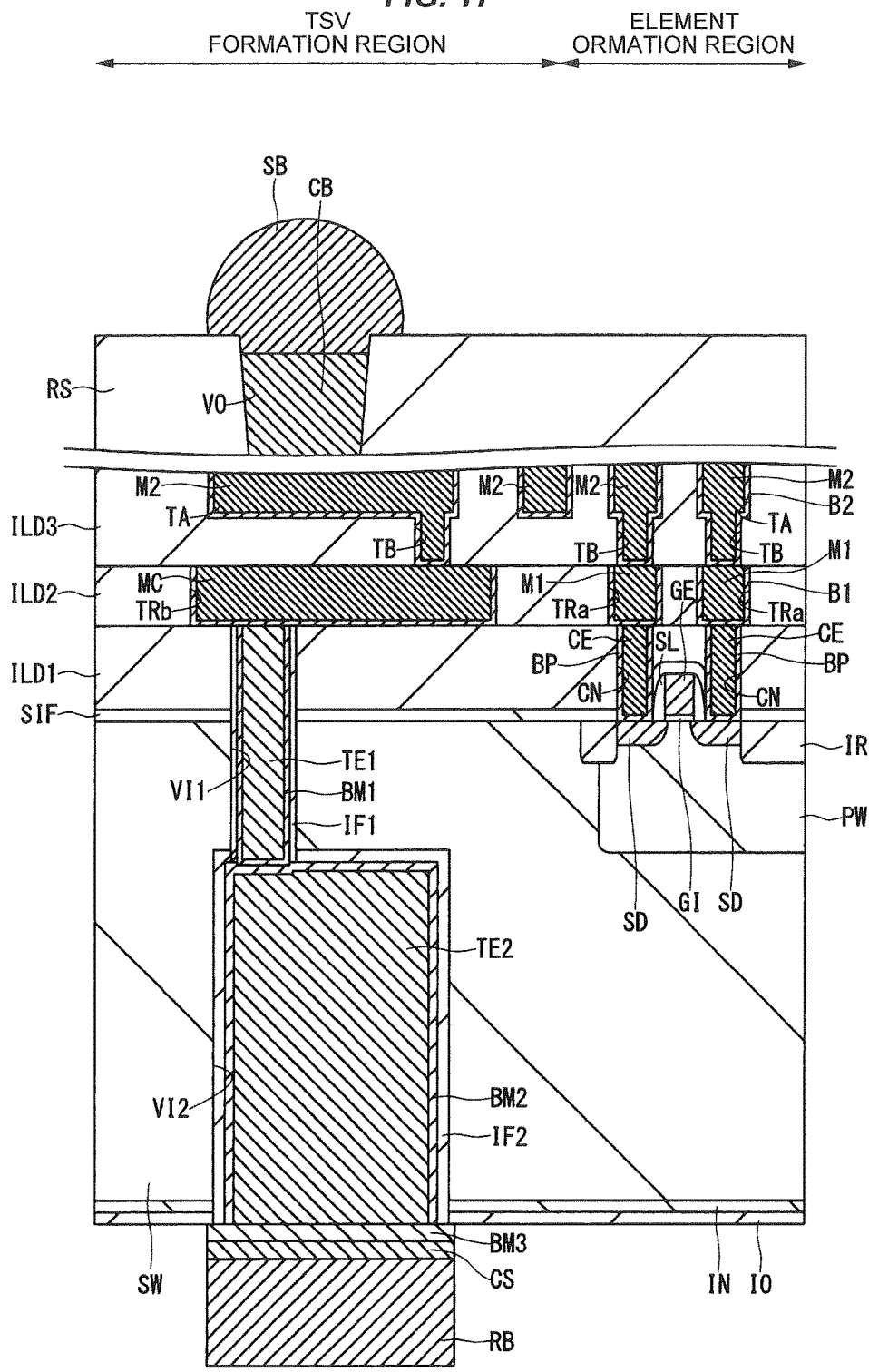
FIG. 17 is a main part cross-sectional view of the same portion as in FIG. 3 during a manufacturing step of the semiconductor device subsequent to FIG. 16.

Next, as shown in FIG. 17, the glass support body GH and the adhesive layer CL are removed. After that, the semiconductor wafer SW in which the semiconductor elements, the through electrode TE, etc. have been formed is diced along a dicing line to individually divide the semiconductor device. By the above steps, the semiconductor device is substantially completed.

As described above, according to the First Embodiment, the through electrode is configured by the small-diameter through electrode TE1 and the large-diameter through electrode TE2, the small-diameter through electrode TE1 is arranged on the main surface side of the semiconductor wafer SW, and thereby the following effects can be obtained.

Since the region (region (keep out zone) where arrangement of the semiconductor elements is constrained) of the semiconductor wafer SW affected by the distortion becomes small, the region where the semiconductor elements can be arranged becomes larger by an amount corresponding to the decreased region of the semiconductor wafer SW affected by the distortion. Furthermore, since the position where the small-diameter through electrode TE1 is formed can be adjusted in the range capable of being coupled to the large-diameter through electrode TE2, the position of the small-diameter through electrode TE1 can be set in accordance with arrangement of the semiconductor elements. Consequently, high integration of the semiconductor elements can be achieved, and the degree of freedom of arrangement of the semiconductor elements also becomes high.

In addition, when the region on the main surface side of the semiconductor wafer SW that the through electrode (small-diameter through electrode TE1) occupies becomes small, the flat surface area of the coupling pad MC coupled to the through electrode also becomes small, so that a region where the first-layer wirings M1 can be arranged becomes large, and the degree of freedom of arrangement of the first-layer wirings M1 also becomes high.

In addition, since the back surface of the semiconductor wafer SW is always covered with the insulating film (silicon nitride ($Si_3N_4$) film IN etc.) when the large-diameter through electrode TE2 is formed, the back surface of the semiconductor wafer SW is not exposed. Consequently, copper (Cu) constituting the large-diameter through electrode TE2 is not diffused into the semiconductor wafer SW from the back surface of the semiconductor wafer SW, and thus change of the operation characteristics of the semiconductor elements due to copper (Cu) contamination can be prevented.

In addition, since the bottom surface of the large-diameter via VI2 does not reach the main surface of the semiconductor wafer SW although the large-diameter via VI2 in which the large-diameter through electrode TE2 is buried is formed from the back surface toward the main surface of the semiconductor wafer SW, there is no risk of etching the multi-layer wirings formed on the main surface side of the semiconductor wafer SW.

<<First Modification>>

A through electrode according to a First Modification of the First Embodiment will be explained using FIGS. 18A and 18B. FIGS. 18A and 18B are respectively main part plan views illustrating arrangement of small-diameter through electrodes and a large-diameter through electrode.

Although one through electrode is configured by one small-diameter through electrode TE1 and one large-diameter through electrode TE2 in the semiconductor device shown in the above-mentioned FIG. 1, the present invention is not limited to this. One through electrode may be configured by one large-diameter through electrode and a plurality of small-diameter through electrodes.

In FIG. 18A, exemplified is one through electrode TEa configured by two small-diameter through electrodes TE1$a$ and one large-diameter through electrode TE2$a$. In a planar view, a diameter of the small-diameter through electrode TE1$a$ is smaller than a diameter of the large-diameter through electrode TE2$a$, and the small-diameter through electrode TE1$a$ is located inside the large-diameter through electrode TE2$a$. In addition, center positions of the small-diameter through electrodes TE1$a$ and a center position of the large-diameter through electrode TE2$a$ do not coincide with each other. Namely, the center positions of the small-diameter through electrodes TE1$a$ are away from the center position of the large-diameter through electrode TE2$a$ in the planar view.

In FIG. 18B, exemplified is one through electrode TEb configured by three small-diameter through electrodes TE1$b$ and one large-diameter through electrode TE2b. In the planar view, a diameter of the small-diameter through electrode TE1b is smaller than a diameter of the large-diameter through electrode TE2b, and the small-diameter through electrode TE1b is located inside the large-diameter through electrode TE2b. In addition, center positions of the small-diameter through electrodes TE1b and a center position of the large-diameter through electrode TE2b do not coincide with each other. Namely, center positions of the small-diameter through electrodes TE1b are away from the center position of the large-diameter through electrode TE2b in the planar view.

As described above, the plurality of small-diameter through electrodes TE1a and TE1b are formed, and thereby electric resistances of the through electrodes TEa and TEb can be more reduced than in a case where one small-diameter through electrode is formed.

<<Second Modification>>

Figure 19:
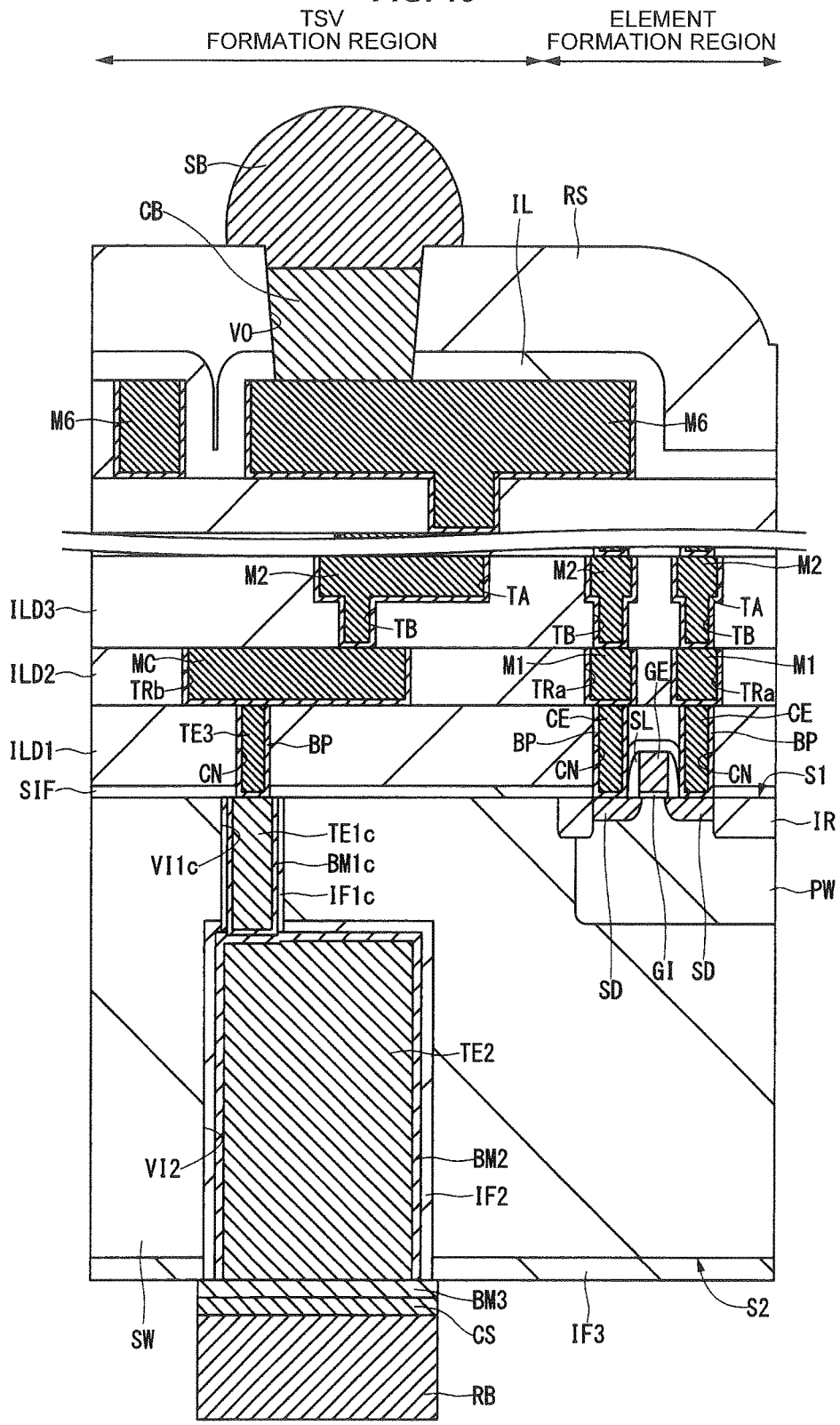
FIG. 19 is a main part cross-sectional view of a semiconductor device including a TSV according to a Second Modification of the First Embodiment.

A through electrode according to a Second Modification of the First Embodiment will be explained using FIG. 19. FIG. 19 is a main part cross-sectional view of the through electrode.

Although in the semiconductor device shown in the above-mentioned FIG. 1, the through electrode is configured by the small-diameter through electrode TE1 buried in the small-diameter via VI1 formed in the interlayer insulating film ILD1, the stopper insulating film SIF, and the semiconductor wafer SW, and the large-diameter through electrode TE2 buried in the large-diameter via VI2 formed in the semiconductor wafer SW, the present invention is not limited to this.

For example, as shown in FIG. 19, a through electrode may be configured by a small-diameter through electrode TE1c buried in a small-diameter via VI1c formed in the semiconductor wafer SW, and the large-diameter through electrode TE2 buried in the large-diameter via VI2 formed in the semiconductor wafer SW. In this case, the coupling pad MC and the small-diameter through electrode TE1c are electrically coupled by a coupling electrode TE3 buried in the connection hole CN formed in the interlayer insulating film ILD1 and the stopper insulating film SIF.

The coupling electrode TE3 is formed in the interlayer insulating film ILD1 and the stopper insulating film SIF, and has a third diameter in the planar view, and one end of the coupling electrode TE3 is coupled to the coupling pad MC via the barrier metal film, and the other end thereof is coupled to the small-diameter through electrode TE1c via the barrier metal film BP. The small-diameter through electrode TE1c is formed in the semiconductor wafer SW from the main surface side of the semiconductor wafer SW, and has a first diameter in the planar view, and one end of the small-diameter through electrode TE1c is coupled to the coupling electrode TE3 via the barrier metal film BP, and the other end thereof is coupled to the large-diameter through electrode TE2 via a barrier metal film BM1c and the barrier metal film BM2. In addition, the large-diameter through electrode TE2 is formed in the semiconductor wafer SW from the back surface side of the semiconductor wafer SW, and has a second diameter in the planar view, and one end of the large-diameter through electrode TE2 is coupled to the small-diameter through electrode TE1c via the barrier metal films BM1c and BM2. Here, the first diameter is smaller than the second diameter, and the third diameter is smaller than the first diameter.

The small-diameter through electrode TE1c and the coupling electrode TE3 can be formed, for example, as follows.

First, a plurality of semiconductor elements is formed on the main surface side of the semiconductor wafer SW.

Next, the semiconductor wafer SW is etched, and a small-diameter via (a first via; a through hole; a connection hole; or an opening) VI1c is formed in the semiconductor wafer SW. Subsequently, after the first insulating film IF1c is formed on the main surface of the semiconductor wafer SW including a bottom surface and a side surface of the small-diameter via VI1c, the barrier metal film BM1c, a copper (Cu) seed layer, and a copper (Cu)-plated film are formed on the main surface of the semiconductor wafer SW (on the first insulating film IF1c). Subsequently, the copper (Cu)-plated film, the seed layer, the barrier metal film BM1c, and the first insulating film IF1c in a region other than an inside of the small-diameter via VI1c are removed to form the small-diameter through electrode TE1c constituted of the copper (Cu) film inside the small-diameter via VI1c.

Next, the stopper insulating film SIF and the interlayer insulating film ILD1 are sequentially formed on the main surface of the semiconductor wafer SW. Subsequently, the interlayer insulating film ILD1 and the stopper insulating film SIF are sequentially etched to form the connection holes CN in the element formation region and the TSV formation region. Subsequently, the barrier metal film BP and the tungsten (W) film are formed on the main surface of the semiconductor wafer SW.

Next, the tungsten (W) film and the barrier metal film BP in a region other than insides of the connection holes CN are removed by the CMP method, the coupling electrodes CE constituted of the tungsten (W) film are formed inside the connection holes CN in the element formation region, and the coupling electrode TE3 is formed in the TSV formation region. Namely, the coupling electrode TE3 is simultaneously formed with the coupling electrodes CE that electrically couple the gate electrode GE etc. of the nMISFET and the first-layer wirings M1 that are formed in the element formation region.

As described above, the coupling electrode TE3 having a third diameter smaller than the second diameter of the small-diameter through electrode TE1c is formed without forming the small-diameter through electrode TE1c in the interlayer insulating film ILD1 and the stopper insulating film SIF, and the coupling pad MC and the small-diameter through electrode TE1c may be electrically coupled using this coupling electrode TE3. As a result of this, a region of the through electrode occupying the interlayer insulating film ILD1 and the stopper insulating film SIF becomes smaller than in a case where the small-diameter through electrode TE1 is formed in the interlayer insulating film ILD1, the stopper insulating film SIF, and the semiconductor wafer SW (refer to the above-mentioned FIG. 1). Particularly, when a region that the coupling electrode TE3 itself occupies becomes small, a flat surface area of the coupling pad MC coupled to the coupling electrode TE3 can also be made small, so that the region where the first-layer wirings M1 can be arranged becomes large, and the degree of freedom of arrangement of the first-layer wirings M1 becomes high.

<<Third Modification>>

Figure 20:
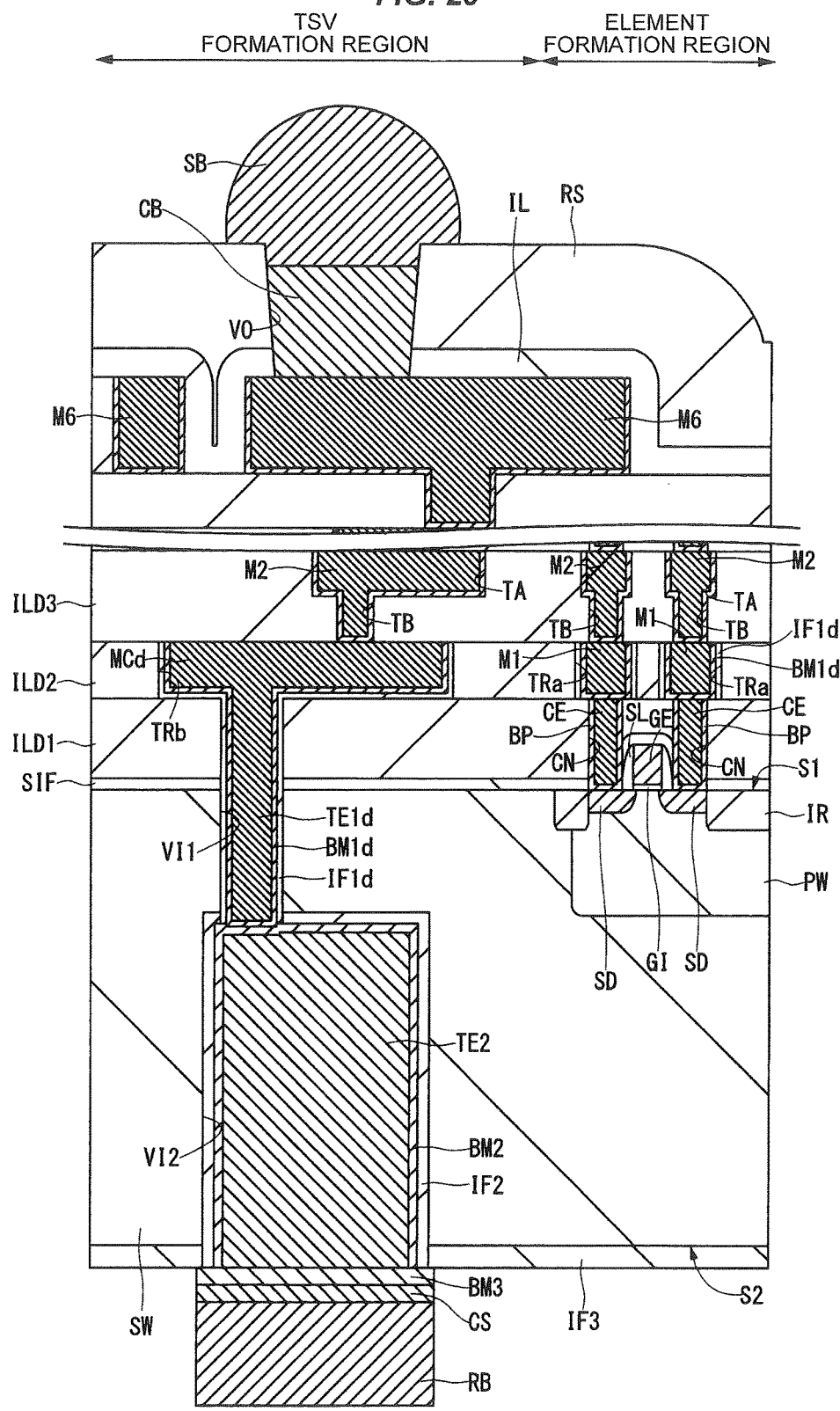
FIG. 20 is a main part cross-sectional view of a semiconductor device including a TSV according to a Third Modification of the First Embodiment.

A through electrode according to a Third Modification of the First Embodiment will be explained using FIG. 20. FIG. 20 is a main part cross-sectional view of the through electrode.

Although in the semiconductor device shown in the above-mentioned FIG. 1, the small-diameter through electrode TE1, the large-diameter through electrode TE2, and the coupling pad MC are configured by mutually different metal conductors, one end of the small-diameter through electrode TE1 is coupled to the coupling pad MC via the barrier metal film, and the other end on an opposite side of the above-mentioned one end is coupled to the large-diameter through electrode TE2 via the barrier metal films BM1 and BM2, the present invention is not limited to this.

For example, as shown in FIG. 20, a small-diameter through electrode TE1d and a coupling pad MCd may be integrally formed with a same metal conductor. As a result of this, the small-diameter through electrode TE1d can be formed simultaneously with the first-layer wirings M1 formed in the element formation region.

The small-diameter through electrode TE1d and the coupling pad MCd can be formed, for example, as follows.

First, a plurality of semiconductor elements is formed on the main surface side of the semiconductor wafer SW. Subsequently, after the stopper insulating film SIF and the interlayer insulating film ILD1 are sequentially formed on the main surface of the semiconductor wafer SW, the stopper insulating film SIF and the interlayer insulating film ILD1 are sequentially etched, the connection holes CN are formed in the element formation region, and the coupling electrodes CE are formed inside the connection holes CN.

Next, after the interlayer insulating film ILD2 is formed on the main surface of the semiconductor wafer SW, the wiring formation trenches TRa are formed in the interlayer insulating film ILD2 of the element formation region, and the coupling pad formation trench TRb is formed in the interlayer insulating film ILD2 of the TSV formation region. Furthermore, the interlayer insulating film ILD1, the stopper insulating film SIF, and the semiconductor wafer SW are sequentially etched from a part of a bottom surface of the coupling pad formation trench TRb to form the small-diameter via VI1.

Next, after forming a first insulating film IF1d on the main surface of the semiconductor wafer SW including the respective bottom surfaces and side surfaces of the small-diameter via VI1, the wiring formation trenches TRa, and the coupling pad formation trench TRb, the first insulating film IF1d of the bottom surfaces of the wiring formation trenches TRa is removed.

Next, a barrier metal film BM1d, a copper (Cu) seed layer, and a copper (Cu)-plated film are formed on the main surface of the semiconductor wafer SW (on the first insulating film IF1d). Subsequently, removed are the copper (Cu)-plated film, the seed layer, the barrier metal film BM1d, and the first insulating film IF1d in a region other than the respective insides of the small-diameter via VI1, the wiring formation trenches TRa, and the coupling pad formation trench TRb. As a result of this, at the same time as the first-layer wirings M1 constituted of the copper (Cu) film are formed inside the wiring formation trenches TRa, the small-diameter through electrode TE1d constituted of the copper (Cu) film buried inside the small-diameter via VI1, and the coupling pad MCd constituted of the copper (Cu) film buried inside the coupling pad formation trench TRb are integrally formed.

As described above, the small-diameter through electrode TE1d is formed simultaneously with the first-layer wirings M1 and the coupling pad MCd, and thereby the number of manufacturing steps can be reduced more than in a manufacturing method that separately performs a step of burying the metal conductor in the small-diameter via VI1, and a step of burying the metal conductors in the wiring formation trenches TRa and the coupling pad formation trench TRb.

Second Embodiment

Figure 21:
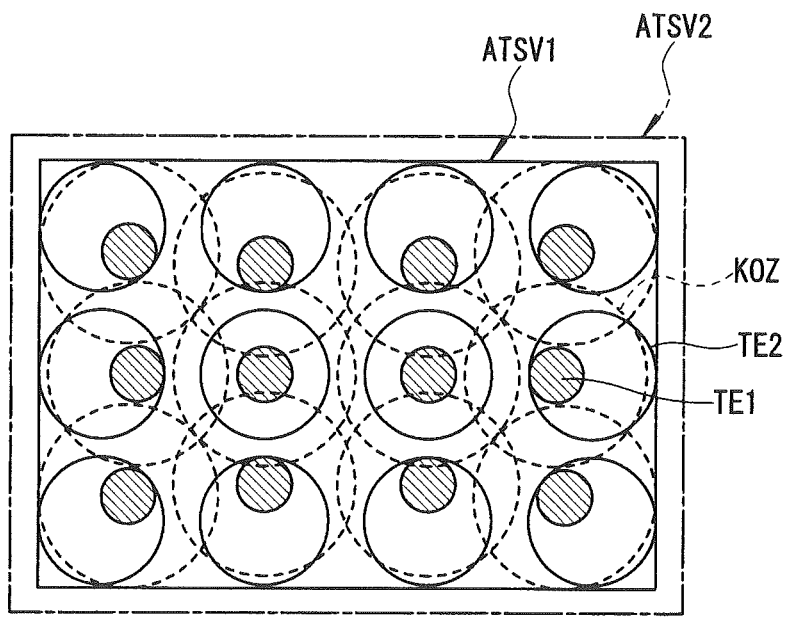
FIG. 21 is a main part plan view illustrating arrangement of small-diameter through electrodes and large-diameter through electrodes when a TSV formation region according to a Second Embodiment is viewed from a plane.
Figure 22:
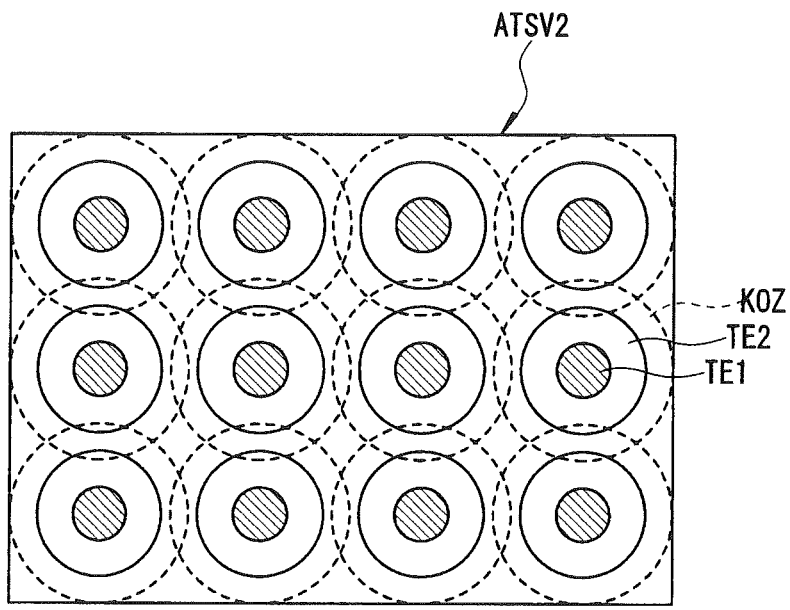
FIG. 22 is a main part plan view illustrating arrangement of small-diameter through electrodes and large-diameter through electrodes when a TSV formation region compared and examined by the present inventors is viewed from a plane.

A semiconductor device including a TSV according to the present Second Embodiment will be explained using FIGS. 21 and 22. FIG. 21 is a main part plan view illustrating arrangement of small-diameter through electrodes and large-diameter through electrodes when a TSV formation region according to the Second Embodiment is viewed from a plane. FIG. 22 is a main part plan view illustrating arrangement of small-diameter through electrodes and large-diameter through electrodes when a TSV formation region compared and examined by the present inventors is viewed from a plane.

In practice, as explained using FIG. 2 of the above-mentioned First Embodiment, hundreds of through electrodes (for example, fifty by six) are formed in the TSV formation region arranged in the center of the semiconductor chip SC. However, twelve through electrodes (four by three) are described in FIGS. 21 and 22 for convenience.

As shown in FIG. 21, a plurality of through electrodes respectively configured by one small-diameter through electrode (a region indicated by hatching) TE1 and one large-diameter through electrode TE2 are arranged in a TSV formation region ATSV1 according to the Second Embodiment. Additionally, the large-diameter through electrodes TE2 are arranged in line mutually at equal intervals (for example, 40 μm pitch), a diameter of the small-diameter through electrode TE1 is smaller than a diameter of the large-diameter through electrode TE2 in a planar view, and the small-diameter through electrode TE1 is located inside the large diameter through electrode TE2 in the planar view.

However, in a through electrode located on an outermost side in the TSV formation region ATSV1, a center position of the small-diameter through electrode TE1 and a center position of the large-diameter through electrode TE2 do not coincide with each other in the planar view, and the center position of the small-diameter through electrode TE1 has been moved in a direction opposite to an outer periphery of the TSV formation region ATSV1 from the center position of the large-diameter through electrode TE2. It is to be noted that the center position of the small-diameter through electrode TE1 and the center position of the large-diameter through electrode TE2 coincide with each other in the planar view in the through electrodes other than the above.

A region (keep out zone) KOZ where arrangement of semiconductor elements is limited is indicated by dotted lines in FIG. 21. Since the small-diameter through electrodes TE1 of the through electrode located on the outermost side in the TSV formation region ATSV1 are arranged in a direction away from the outer periphery of the TSV formation region ATSV1, the region (keep out zone) KOZ where arrangement of the semiconductor elements is limited is also moved inside the TSV formation region ATSV1.

As a comparative example, a TSV formation region ATSV2 is shown in FIG. 22 where a through electrode in which the center position of the small-diameter through electrode TE1 and the center position of the large-diameter through electrode TE2 coincide with each other in the planar view has been arranged in the whole region. Although arrangement of the large-diameter through electrodes TE2 in the TSV formation region ATSV2 is the same as that of the large-diameter through electrodes TE2 in the TSV formation region ATSV1 shown in FIG. 21, the region (keep out zone) KOZ where arrangement of the semiconductor elements is limited spreads out concentrically with the large-diameter through electrode TE2 in the TSV formation region ATSV2. Therefore, the TSV formation region ATSV2 means a region also including the region (keep out zone) KOZ that spreads out concentrically with the large-diameter through electrode TE2, and where arrangement of the semiconductor elements is limited.

The TSV formation region ATSV2 shown in FIG. 22 is indicated by long dashed dotted lines in FIG. 21. It turns out that a flat surface area of the TSV formation region ATSV1 according to the Second Embodiment is smaller than a flat surface area of the TSV formation region ATSV2.

As described above, in the Second Embodiment, the small-diameter through electrodes TE1 of the through electrode located on the outermost side of the TSV formation region ATSV1 are arranged in the direction away from the outer periphery of the TSV formation region ATSV1 and thereby the region (keep out zone) KOZ where arrangement of the semiconductor elements is limited can be moved inside the TSV formation region ATSV1. As a result of this, since the flat surface area of the TSV formation region ATSV1 becomes small, and a region corresponding to the decreased flat surface area can be used as the element formation region, it becomes possible to achieve high integration of the semiconductor elements or reduction in size of the semiconductor chip.

Hereinbefore, although the invention made by the present inventors has been specifically explained based on the embodiments, the present invention is not limited to the above-described embodiments, and it is needless to say that various changes can be made without departing from the spirit of the present invention.

What is claimed is:

1. A method of manufacturing a semiconductor device, the method comprising:
   (a) forming a first via having a first diameter in a first main surface of a semiconductor substrate having a first thickness;
   (b) after forming a first insulating film on a bottom surface and a side surface of the first via, forming a first through electrode inside the first via filled with a first barrier metal film;
   (c) after (b), processing the semiconductor substrate from a second main surface on an opposite side of the first main surface to reduce the first thickness of the semiconductor substrate to a second thickness thinner than the first thickness;
   (d) after (c), forming a third insulating film on the second main surface of the semiconductor substrate;
   (e) after (d), sequentially processing the third insulating film and the semiconductor substrate to form a second via having a second diameter larger than the first diameter in the second main surface of the semiconductor substrate, and causing a part of the first through electrode covered with the first insulating film and the first barrier metal film to project from a bottom surface of the second via;
   (f) after (e), after forming a second insulating film on the bottom surface and a side surface of the second via, removing the second insulating film and the first insulating film which cover the part of the first through electrode projecting from the bottom surface of the second via to expose the first barrier metal film that covers the first through electrode from the bottom surface of the second via; and
   (g) after (f), forming a second through electrode inside the second via filled with a second barrier metal film,
   wherein the first through electrode is located inside the second through electrode in a plan view, and a center position of the first through electrode is away from a center position of the second through electrode in the plan view, and
   wherein, in the plan view, a side surface of the first through electrode overlaps with a side surface of the second through electrode.

2. The method of manufacturing a semiconductor device according to claim 1, further comprising before (a), forming an interlayer insulating film on the first main surface of the semiconductor substrate,
   wherein in (a), the first via having the first diameter is formed in the interlayer insulating film and the first main surface of the semiconductor substrate.

3. The method of manufacturing a semiconductor device according to claim 1, wherein the first insulating film and the second insulating film include silicon oxide films, and the third insulating film includes a stacked film in which a silicon nitride film and a silicon oxide film are formed sequentially from a side of the second main surface of the semiconductor substrate.

4. The method of manufacturing a semiconductor device according to claim 1, wherein the third insulating film is formed by a plasma Chemical Vapor Deposition (CVD) method or a gas cluster ion beam method.

5. The method of manufacturing a semiconductor device according to claim 1, wherein the first through electrode comprises one of a plurality of through electrodes located in a first region of the semiconductor device, and the second through electrode comprises one of a plurality of second through electrodes located in the first region of the semiconductor device, and
   wherein the semiconductor device comprises a plurality of semiconductor elements located in a second region of the semiconductor device.

6. The method of manufacturing a semiconductor device according to claim 5, wherein, in the plan view, the second through electrodes in the first region are arranged at a same pitch.

7. The method of manufacturing a semiconductor device according to claim 6, wherein, in the plan view, the center position of each of the first through electrodes, located near an outer periphery of the first region, is arranged toward a center of the first region.

8. The method of manufacturing a semiconductor device according to claim 5, wherein, in the plan view, the center position of each of the first through electrodes, located near an outer periphery of the first region, is arranged toward a center of the first region.

9. The method of manufacturing a semiconductor device according to claim 5, wherein, in the plan view, the center position of each of the first through electrodes located near an outer periphery of the first region is offset from a center position of each of a corresponding second through electrodes that encircle said each of the first through electrodes located near the outer periphery of the first region.

10. The method of manufacturing a semiconductor device according to claim 5, wherein, in the plan view, the center position of one of the first through electrodes located near an outer periphery of the first region is offset from a center position of a corresponding one of the second through electrodes that encircle said one of the first through electrodes located near the outer periphery of the first region.

11. The method of manufacturing a semiconductor device according to claim 5, wherein, in the plan view, with respect to a center position of each of a corresponding second through electrodes that encircles each of the first through electrodes located near an outer periphery of the first region, the center position of said each of the first through electrodes, located near the outer periphery of the first region, is shifted toward the center of the first region.

12. The method of manufacturing a semiconductor device according to claim 5, wherein, in the plan view, with respect to a center position of each of a corresponding second through electrodes that encircles each of the first through electrodes located near an outer periphery of the first region, the center position of each of the first through electrodes located near the outer periphery of the first region is shifted in a direction opposite to the outer periphery of the first region toward the center of the first region.

13. The method of manufacturing a semiconductor device according to claim 5, wherein, in the plan view, a center position of one of the first through electrodes, located adjacent to a center of the first region and away from an outer periphery of the first region, coincides with a center position of a corresponding one of the second through electrodes that encircles said one of the first through electrodes, located adjacent to the center of the first region and away from the outer periphery of the first region.

14. The method of manufacturing a semiconductor device according to claim 5, wherein, in the plan view, a center position of each of the first through electrodes, located adjacent to a center of the first region and away from an outer periphery of the first region, coincides with a center position of a corresponding one of the second through electrodes that encircles said each of the first through electrodes, located adjacent to the center of the first region and away from the outer periphery of the first region.

15. A method of manufacturing a semiconductor device, the method comprising:
 forming a first region where a plurality of through electrodes penetrating from a first main surface of a semiconductor substrate to a second main surface on an opposite side of the first main surface has been formed; and
 forming a second region where a plurality of semiconductor elements has been formed on the first main surface of the semiconductor substrate,
 wherein each of the through electrodes is configured by:
  first through electrodes having a first diameter and formed on a first main surface side of the semiconductor substrate; and
  second through electrodes having a second diameter, larger than the first diameter, and formed on a second main surface side of the semiconductor substrate,
 wherein each of the first through electrodes is located inside each of the second through electrodes in a plan view, and a center position of said each of the first through electrodes is away from a center position of said each of the second through electrodes in the plan view, and
 wherein, in the plan view, the center position of said each of the first through electrodes located near an outer periphery of the first region is arranged toward a center of the first region.

16. The method of manufacturing a semiconductor device according to claim 15, wherein, in the plan view, the second through electrodes in the first region are arranged at a same pitch.

17. The method of manufacturing a semiconductor device according to claim 15, wherein, in the plan view, the center position of each of the first through electrodes located near the outer periphery of the first region is offset from a center position of each of a corresponding second through electrodes that encircles said each of the first through electrodes located near the outer periphery of the first region.

18. The method of manufacturing a semiconductor device according to claim 15, wherein, in the plan view, the center position of one of the first through electrodes located near the outer periphery of the first region is offset from a center position of a corresponding one of the second through electrodes that encircles said one of the first through electrodes located near the outer periphery of the first region.

19. The method of manufacturing a semiconductor device according to claim 15, wherein, in the plan view, with respect to a center position of each of a corresponding second through electrodes that encircles each of the first through electrodes located near the outer periphery of the first region, the center position of said each of the first through electrodes, located near the outer periphery of the first region, is shifted toward the center of the first region.

20. The method of manufacturing a semiconductor device according to claim 15, wherein, in the plan view, a center position of each of the first through electrodes, located adjacent to the center of the first region and away from the outer periphery of the first region, coincides with a center position of a corresponding one of the second through electrodes that encircle said each of the first through electrodes, located adjacent to the center of the first region and away from the outer periphery of the first region.

* * * * *